(12) United States Patent
Goktepeli et al.

(10) Patent No.: US 10,680,086 B2
(45) Date of Patent: Jun. 9, 2020

(54) RADIO FREQUENCY SILICON-ON-INSULATOR INTEGRATED HETEROJUNCTION BIPOLAR TRANSISTOR

(71) Applicant: QUALCOMM Incorporated, San Diego, CA (US)

(72) Inventors: Sinan Goktepeli, San Diego, CA (US); George Pete Imthurn, San Diego, CA (US); Stephen Alan Fanelli, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/011,430

(22) Filed: Jun. 18, 2018

(65) Prior Publication Data
US 2019/0386121 A1   Dec. 19, 2019

(51) Int. Cl.
| | |
|---|---|
| *H01L 29/737* | (2006.01) |
| *H01L 29/08* | (2006.01) |
| *H01L 29/10* | (2006.01) |
| *H01L 29/417* | (2006.01) |
| *H01L 29/66* | (2006.01) |

(52) U.S. Cl.
CPC ...... *H01L 29/7371* (2013.01); *H01L 29/0821* (2013.01); *H01L 29/1004* (2013.01); *H01L 29/41708* (2013.01); *H01L 29/66242* (2013.01)

(58) Field of Classification Search
CPC .......... H01L 29/7371; H01L 29/0821
USPC ........................................ 257/197
See application file for complete search history.

(56) References Cited

U.S. PATENT DOCUMENTS

| | | | | |
|---|---|---|---|---|
| 5,399,880 A | * | 3/1995 | Chand | B82Y 20/00 257/184 |
| 5,424,227 A | * | 6/1995 | Dietrich | H01L 29/66242 257/E21.371 |
| 5,780,880 A | * | 7/1998 | Enquist | H01L 29/7371 257/188 |
| 6,414,371 B1 | * | 7/2002 | Freeman | H01L 21/8222 257/584 |
| 7,611,953 B2 | | 11/2009 | Ahlgren et al. | |
| 7,622,357 B2 | | 11/2009 | Vaed et al. | |
| 9,536,788 B1 | | 1/2017 | Ning et al. | |

(Continued)

FOREIGN PATENT DOCUMENTS

CN   103022111 A   4/2013

OTHER PUBLICATIONS

International Search Report and Written Opinion—PCT/US2019/037538—ISA/EPO—dated Nov. 14. 2019.

*Primary Examiner* — Igwe U Anya
(74) *Attorney, Agent, or Firm* — Seyfarth Shaw LLP

(57) ABSTRACT

A heterojunction bipolar transistor is integrated on radio frequency (RF) dies of different sizes. The heterojunction bipolar transistor includes an emitter on a first-side of a semiconductor-on-insulator (SOI) layer of an SOI substrate. The emitter is accessed from the first-side while a collector is accessed from a second-side of the SOI substrate. One or more portions of a base of the heterojunction bipolar transistor is between the emitter and one or more portions of the collector. The heterojunction bipolar transistor also includes a compound semiconductor layer between the collector and the emitter. The compound semiconductor layer carries a charge between the emitter and the collector.

16 Claims, 20 Drawing Sheets

(56) References Cited

U.S. PATENT DOCUMENTS

| | | | |
|---|---|---|---|
| 9,660,110 B2 | 5/2017 | Kim et al. | |
| 9,780,210 B1 | 10/2017 | Goktepeli et al. | |
| 10,068,997 B1 * | 9/2018 | Preisler | H01L 29/0817 |
| 2004/0212034 A1 | 10/2004 | Mochizuki et al. | |
| 2006/0141682 A1 * | 6/2006 | Taylor | H01L 29/155 |
| | | | 438/142 |
| 2007/0275533 A1 * | 11/2007 | Vaed | H01L 21/76898 |
| | | | 438/329 |
| 2008/0121938 A1 * | 5/2008 | Morita | H01L 29/2003 |
| | | | 257/198 |
| 2008/0206977 A1 | 8/2008 | Frank et al. | |
| 2012/0091509 A1 * | 4/2012 | Liu | H01L 29/0821 |
| | | | 257/197 |
| 2013/0119434 A1 * | 5/2013 | Adkisson | H01L 29/732 |
| | | | 257/197 |
| 2013/0210210 A1 * | 8/2013 | Gluschenkov | H01L 29/0821 |
| | | | 438/310 |
| 2015/0187751 A1 * | 7/2015 | Quaglietta | H01L 27/0248 |
| | | | 257/491 |
| 2017/0373175 A1 | 12/2017 | Gu et al. | |
| 2018/0211897 A1 * | 7/2018 | Yang | H01L 23/49568 |

* cited by examiner

RADIO FREQUENCY SILICON-ON-INSULATOR INTEGRATED HETEROJUNCTION BIPOLAR TRANSISTOR

BACKGROUND

Field

The present disclosure relates generally to compound semiconductor devices, and more specifically, to a radio frequency (RF) silicon-on-insulator (SOI) integrated heterojunction bipolar transistor (HBT).

Background

A wireless device (e.g., a cellular phone or a smartphone) in a wireless communication system may include a radio frequency (RF) transceiver to transmit and receive data for two-way communication. The RF transceiver may include a transmit section for data transmission and a receive section for data reception. Different types of amplifiers are available in the transceiver for different uses.

For data transmission, the transmit section or transmitter may modulate an RF carrier signal with data to obtain a modulated RF signal, to amplify the modulated RF signal to obtain an amplified RF signal having the proper output power level, and to transmit the amplified RF signal via an antenna to a base station. For data reception, the receive section or receiver may obtain a received RF signal via the antenna and may amplify and process the received RF signal to recover data sent by the base station.

The receiver may utilize a low noise amplifier (LNA), the transmitter may utilize a power amplifier (PA), and the receiver and transmitter may utilize variable gain amplifiers (VGAs). The receive section may include one or more circuits for receiving and amplifying a communication signal. The amplifier circuits may include one or more low noise amplifier stages. Each of the amplifier stages includes one or more transistors configured in various ways to amplify the communication signal. The transistors configured to amplify the communication signal are generally selected to operate at substantially higher frequencies for supporting communication enhancements, such as carrier aggregation. These transistors are commonly implemented using compound semiconductor transistors, such as bipolar junction transistors (BJTs), heterojunction bipolar transistors (HBTs), and the like. However, conventional HBTs are difficult to integrate with other RF components on a same die.

SUMMARY

An heterojunction bipolar transistor may include an emitter on a first-side of a semiconductor-on-insulator (SOI) layer of an SOI substrate. The emitter is accessed from the first-side while a collector is accessed from a second-side of the SOI layer. One or more portions of a base of the heterojunction bipolar transistor is between the emitter and one or more portions of the collector. The base includes a compound semiconductor layer between the collector and the emitter. The compound semiconductor layer carries a charge between the emitter and the collector.

A method of making a heterojunction bipolar transistor (HBT) may include fabricating an emitter on a first-side of a semiconductor-on-insulator (SOI) layer of an SOI substrate. The emitter is accessed from the first-side. The method may further include fabricating a collector accessed from a second-side of the SOI layer. The method also includes fabricating one or more portions of a base between the emitter and one or more portions of the collector. Fabricating the one or more portions of the base include fabricating a compound semiconductor layer between the collector and the emitter. The compound semiconductor layer carries a charge between the emitter and the collector.

A radio frequency (RF) front end module comprises a heterojunction bipolar transistor (HBT) having an emitter on a first-side of a semiconductor-on-insulator (SOI) layer of an SOI substrate. The emitter is accessed from the first-side. The HBT also has a collector accessed from a second-side of the SOI layer. At least a portion of a base is between the emitter and at least a portion of the collector. The base further includes a compound semiconductor layer between the emitter and the collector. The compound semiconductor layer is configured to carry a charge between the emitter and the collector. The RF front end also has an antenna coupled to the HBT.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

Figure 1:
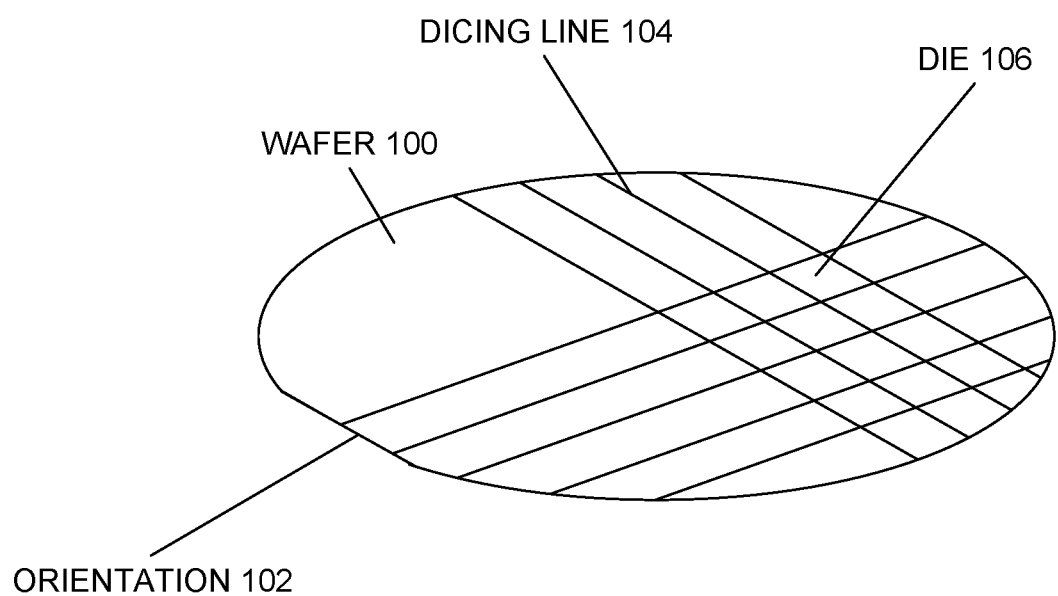
FIG. 1 illustrates a perspective view of a semiconductor wafer.

The detailed description set forth below, in connection with the appended drawings, is intended as a description of various configurations and is not intended to represent the only configurations in which the concepts described may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described, the use of the term "and/or" is intended to represent an "inclusive OR", and the use of the term "or" is intended to represent an "exclusive OR".

The term "exemplary," used throughout this description means "serving as an example, instance, or illustration," and should not necessarily be construed as preferred or advantageous over other aspects of the present disclosure. The term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches.

Fabrication of mobile radio frequency (RF) chips (e.g., mobile RF transceivers) becomes complex at deep sub-micron process nodes due to cost and power consumption considerations. A wireless device (e.g., a cellular phone or a smartphone) in a wireless communication system may include a radio frequency (RF) transceiver to transmit and receive data for two-way communication. A mobile RF transceiver may include a transmit section for data transmission and a receive section for data reception.

The receive section may include one or more circuits for receiving and amplifying a communication signal. The amplifier circuits may include one or more low noise amplifier stages. Each of the amplifier stages include one or more transistors configured in various ways to amplify the communication signal. The transistors may be bipolar transistors or bipolar junction transistors.

Bipolar junction transistors (BJTs) are a type of transistor that uses both hole and electron carriers. Bipolar junction transistors are fabricated in integrated circuits and are also used as individual components. Bipolar junction transistors can be designed for amplification of signals. This basic function of bipolar junction transistors makes them a logical choice for implementing amplifiers such as low noise amplifiers. As a result, bipolar junction transistors are widely used in electronic equipment, such as cellular phones, audio amplifiers, and radio transmitters. For example, the bipolar junction transistors may be used in radio frequency (RF) low noise amplifier (LNA) devices.

A heterojunction bipolar transistor (HBT) (e.g., SiGe (silicon germanium) heterojunction bipolar transistors (HBT)) is a type of bipolar transistor that uses different semiconductor materials for emitters and base regions of the device, which create a heterojunction. A heterojunction bipolar transistor may use a III-V compound semiconductor material, a II-VI compound semiconductor material, or other like compound semiconductor material. Column III-V (and II-VI) compound semiconductor materials generally exhibit high carrier mobility and direct energy gaps. Heterojunction bipolar transistors improve upon bipolar transistors by supporting substantially higher frequencies (e.g., up to several hundred gigahertz (GHz)). Heterojunction bipolar transistors are, therefore, often used in high speed circuits in mobile RF transceivers.

Integrating HBTs with other RF components on a same die is challenging. For example, incorporating HBTs on a silicon on insulator (SOI) wafer is tedious. This follows because a base, a collector, and an emitter of the HBT are all located on a same side. This configuration results in high parasitic capacitance, high parasitic resistance, and high self-heating. The self-heating may be due to ohmic heating and the presence of a buried oxide layer at the bottom of the HBT. Additionally, the collector is highly resistive because the current flows through a thin silicon. Accordingly, it is desirable to implement a HBT (e.g., SiGe HBT) device that overcomes these deficiencies.

Aspects of the present disclosure describe integrating a heterojunction bipolar transistor (e.g., SiGe HBT) device on radio frequency (RF) wafers of different sizes. The heterojunction bipolar transistor includes an emitter on a first side of a semiconductor-on-insulator (SOI) layer of an SOI substrate, a collector accessed from a second side of the SOI substrate, and a base including compound semiconductor layer. At least a portion of a base is between the emitter and at least a portion of the collector. The compound semiconductor layer is between the collector and the emitter. The compound semiconductor layer is configured to carry a charge between the emitter and the collector.

FIG. 1 illustrates a perspective view of a semiconductor wafer used for fabricating a heterojunction bipolar transistor. A wafer 100 may be a semiconductor wafer, or may be a substrate material with one or more layers of semiconductor material on a surface of the wafer 100. When the wafer 100 is a semiconductor material, it may be grown from a seed crystal using the Czochralski process, where the seed crystal is dipped into a molten bath of semiconductor material and slowly rotated and removed from the bath. The molten material then crystalizes onto the seed crystal in the orientation of the crystal.

The wafer 100 may be a compound material, such as gallium arsenide (GaAs) or gallium nitride (GaN), a ternary material such as indium gallium arsenide (InGaAs), quaternary materials, or any material that can be a substrate material for other semiconductor materials. Although many of the materials may be crystalline in nature, polycrystalline or amorphous materials may also be used for the wafer 100.

The wafer 100, or layers that are coupled to the wafer 100, may be supplied with materials that make the wafer 100 more conductive. For example, and not by way of limitation, a silicon wafer may have phosphorus or boron added to the wafer 100 to allow for electrical charge to flow in the wafer 100. These additives are referred to as dopants, and provide extra charge carriers (either electrons or holes) within the wafer 100 or portions of the wafer 100. By selecting the areas where the extra charge carriers are provided, which type of charge carriers are provided, and the amount (density) of additional charge carriers in the wafer 100, different types of electronic devices may be formed in or on the wafer 100.

The wafer 100 has an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100. The orientation 102 may indicate the Miller Indices for the planes of the crystal lattice in the wafer 100.

Once the wafer 100 has been processed as desired, the wafer 100 is divided up along dicing lines 104. The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawn or otherwise separated into pieces to form die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

Once the wafer 100 has been separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that provide access to the die 106. The die 106 may also be directly accessed through wire bonding, probes, or other connections without mounting the die 106 into a separate package.

Figure 2:
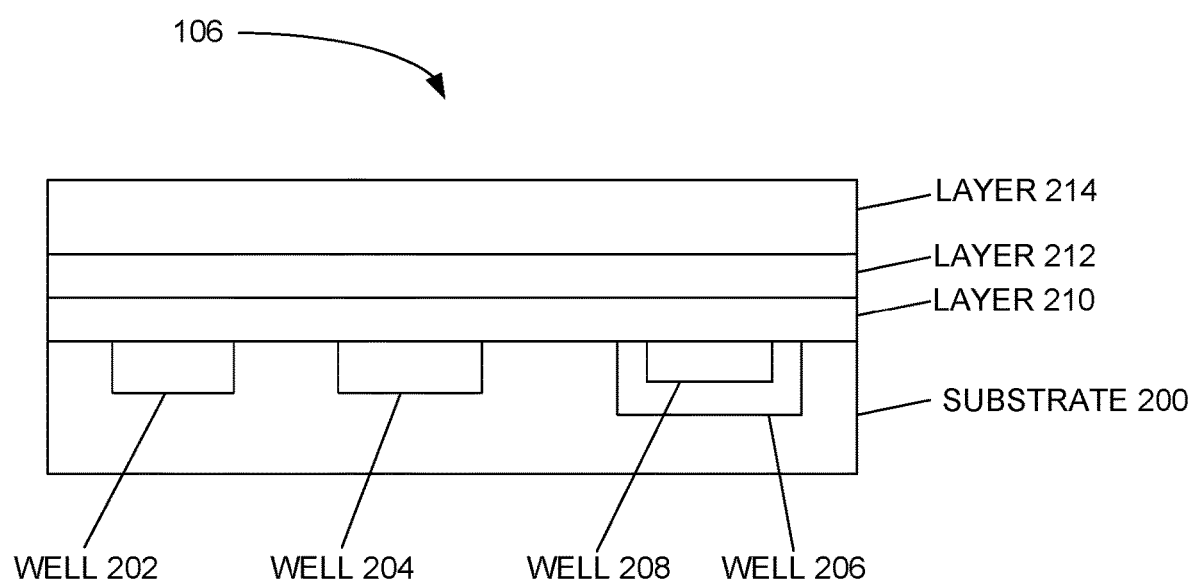
FIG. 2 illustrates a cross-sectional view of a die.

FIG. 2 illustrates a cross-sectional view of a die 106. In the die 106, there may be a substrate 200, which may be a semiconductor material and/or may act as a mechanical support for electronic devices. The substrate 200 may be a doped semiconductor substrate, which has either electrons (designated N-channel) or holes (designated P-channel) charge carriers present throughout the substrate 200. Subsequent doping of the substrate 200 with charge carrier ions/atoms may change the charge carrying capabilities of the substrate 200. Alternatively, the substrate may be a semi-insulating substrate, including compound semiconductor transistors.

Within a substrate 200 (e.g., a semiconductor substrate), there may be wells 202 and 204, which may be the source and/or drain of a field-effect transistor (FET), or wells 202 and/or 204 may be fin structures of a fin structured FET (FinFET). Wells 202 and/or 204 may also be other devices (e.g., a resistor, a capacitor, a diode, or other electronic devices) depending on the structure and other characteristics of the wells 202 and/or 204 and the surrounding structure of the substrate 200.

The semiconductor substrate may also have a well 206 and a well 208. The well 208 may be completely within the well 206, and, in some cases, may form a bipolar junction transistor (BJT), a heterojunction bipolar transistor (HBT), or other like compound semiconductor transistor. The well 206 may also be used as an isolation well to isolate the well 208 from electric and/or magnetic fields within the die 106.

Layers (e.g., 210 through 214) may be added to the die 106. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer. The layer 210 may also be an interconnection layer, in which case it may comprise a conductive material such as copper, tungsten, aluminum, an alloy, or other conductive or metallic materials.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the layers (e.g., 210-214). For example, and not by way of limitation, the die 106 may be exposed to ion implantation, deposition of dopant atoms that are driven into a crystalline lattice through a diffusion process, chemical vapor deposition, epitaxial growth, or other methods. Through selective growth, material selection, and removal of portions of the layers (e.g., 210-214), and through selective removal, material selection, and dopant concentration of the substrate 200 and the wells 202-208, many different structures and electronic devices may be formed within the scope of the present disclosure.

Further, the substrate 200, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure. Aspects of the present disclosure may be directed to reducing heat in heterojunction bipolar transistors or other like compound semiconductor transistors.

A heterojunction bipolar transistor (HBT) is a type of bipolar transistor that uses different semiconductor materials for emitters and base regions of the device, which creates a heterojunction. A heterojunction bipolar transistor may use a III-V compound semiconductor material, a II-VI compound semiconductor material, or other like compound semiconductor material. III-V (and II-VI) compound semiconductor materials generally exhibit high carrier mobility and direct energy gaps. Heterojunction bipolar transistors improve upon bipolar transistors by supporting substantially higher frequencies (e.g., up to several hundred gigahertz (GHz)). Heterojunction bipolar transistors are, therefore, often used in high speed circuits, such as RF chip designs including RF power amplifiers in mobile RF transceivers, for example, as shown in FIG. 3.

Figure 3:
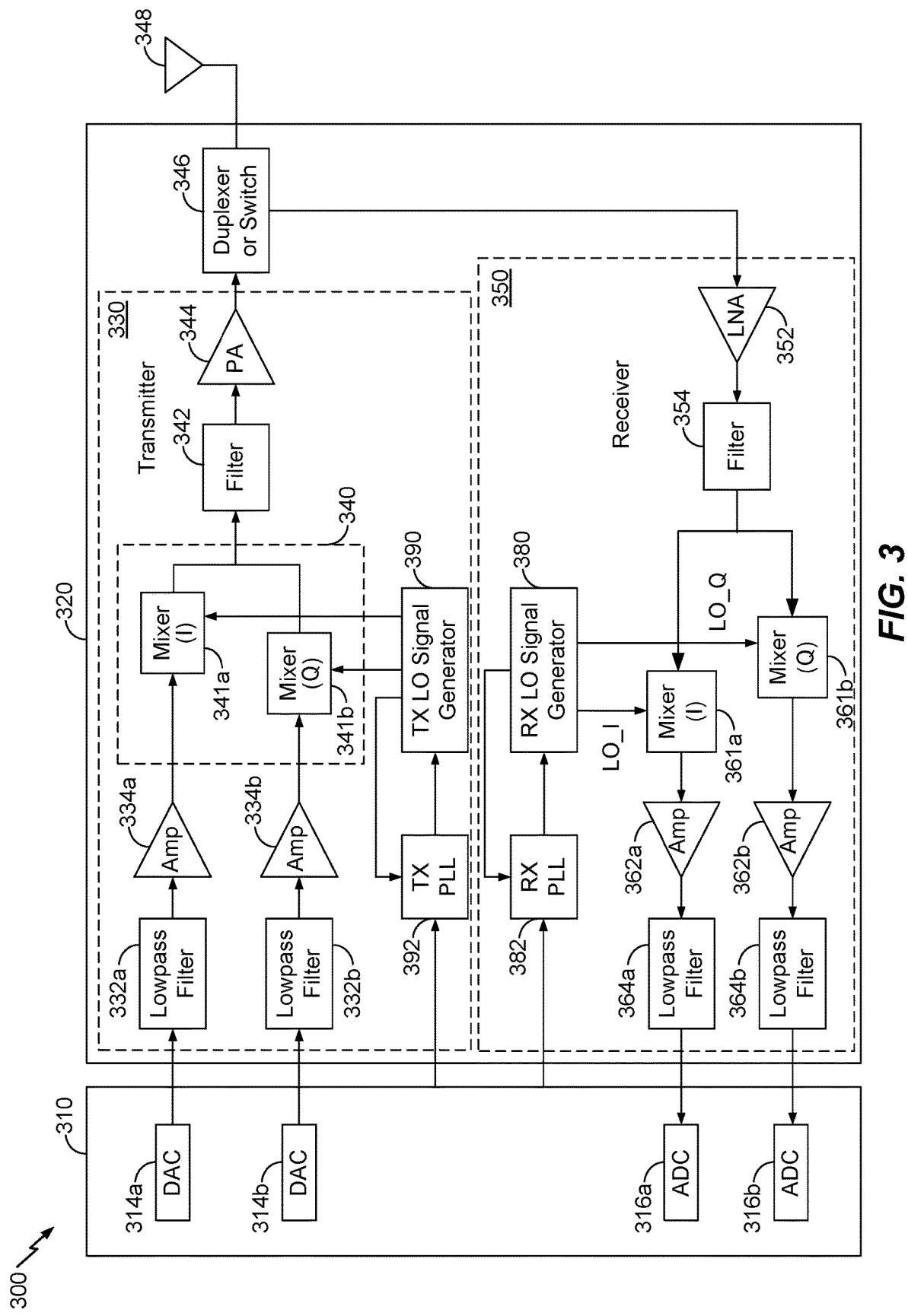
FIG. 3 shows a block diagram of an exemplary wireless device.

FIG. 3 shows a block diagram of an exemplary design of a wireless device 300. FIG. 3 shows an example of a transceiver 320, which may be a wireless transceiver (WTR). In general, the conditioning of the signals in a transmitter 330 and a receiver 350 may be performed by one or more stages of amplifier(s), filter(s), upconverters, downconverters, and the like. These circuit blocks may be arranged differently from the configuration shown in FIG. 3. Furthermore, other circuit blocks not shown in FIG. 3 may also be used to condition the signals in the transmitter 330 and receiver 350. Unless otherwise noted, any signal in FIG. 3, or any other figure in the drawings, may be either single-ended or differential. Some circuit blocks in FIG. 3 may also be omitted.

In the example shown in FIG. 3, the wireless device 300 generally includes the transceiver 320 and a data processor 310. The data processor 310 may include a memory (not shown) to store data and program codes, and may generally include analog and digital processing elements. The transceiver 320 may include the transmitter 330 and receiver 350 that support bi-directional communication. In general, the wireless device 300 may include any number of transmitters and/or receivers for any number of communication systems and frequency bands. All or a portion of the transceiver 320 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and then from intermediate frequency to baseband in another stage for a receiver. In the direct-conversion architecture, a signal is frequency converted between radio frequency and baseband in one stage. The super-heterodyne and direct-conversion architectures may use different circuit blocks and/or have different requirements. In the example shown in FIG. 3, the transmitter 330 and the receiver 350 are implemented with the direct-conversion architecture.

In a transmit path, the data processor 310 processes data to be transmitted. The data processor 310 also provides in-phase (I) and quadrature (Q) analog output signals to the transmitter 330 in the transmit path. In an exemplary aspect, the data processor 310 includes digital-to-analog-converters (DACs) 314a and 314b for converting digital signals generated by the data processor 310 into the in-phase (I) and quadrature (Q) analog output signals (e.g., I and Q output currents) for further processing.

Within the transmitter 330, low pass filters 332a and 332b filter the in-phase (I) and quadrature (Q) analog transmit signals, respectively, to remove undesired images caused by the prior digital-to-analog conversion. Amplifiers (Amp) 334a and 334b amplify the signals from low pass filters 332a and 332b, respectively, and provide in-phase (I) and quadrature (Q) baseband signals. Upconversion mixers 341a and 341b of an upconverter 340 upconverts the in-phase (I) and quadrature (Q) baseband signals with in-phase (I) and quadrature (Q) transmit (TX) local oscillator (LO) signals from a TX LO signal generator 390 to provide an upconverted signal. A filter 342 filters the upconverted signal to remove undesired images caused by the frequency upconversion as well as noise in a receive frequency band. A power amplifier (PA) 344 amplifies the signal from the filter 342 to obtain the desired output power level and provides a transmit radio frequency signal. The transmit radio frequency signal is routed through a duplexer/switch 346 and transmitted via an antenna 348.

In a receive path, the antenna 348 receives communication signals and provides a received radio frequency (RF) signal, which is routed through the duplexer/switch 346 and provided to a low noise amplifier (LNA) 352. The duplexer/switch 346 is designed to operate with a specific receive (RX) to transmit (TX) (RX-to-TX) duplexer frequency separation, such that RX signals are isolated from TX signals. The received RF signal is amplified by the LNA 352 and filtered by a filter 354 to obtain a desired RF input signal. Downconversion mixers 361a and 361b mix the output of the filter 354 with in-phase (I) and quadrature (Q) receive (RX) LO signals (i.e., LO_I and LO_Q) from an RX LO signal generator 380 to generate in-phase (I) and quadrature (Q) baseband signals. The in-phase (I) and quadrature (Q) baseband signals are amplified by amplifiers 362a and 362b and further filtered by low pass filters 364a and 364b to obtain in-phase (I) and quadrature (Q) analog input signals, which are provided to the data processor 310. In the exemplary configuration shown, the data processor 310 includes analog-to-digital-converters (ADCs) 316a and 316b for converting the analog input signals into digital signals for further processing by the data processor 310.

In FIG. 3, the transmit local oscillator (TX LO) signal generator 390 generates the in-phase (I) and quadrature (Q) TX LO signals used for frequency upconversion, while a receive local oscillator (RX LO) signal generator 380 generates the in-phase (I) and quadrature (Q) RX LO signals used for frequency downconversion. Each LO signal is a periodic signal with a particular fundamental frequency. A phase locked loop (PLL) 392 receives timing information from the data processor 310 and generates a control signal used to adjust the frequency and/or phase of the TX LO signals from the TX LO signal generator 390. Similarly, a PLL 382 receives timing information from the data processor 310 and generates a control signal used to adjust the frequency and/or phase of the RX LO signals from the RX LO signal generator 380.

The wireless device 300 may support carrier aggregation and may (i) receive multiple downlink signals transmitted by one or more cells on multiple downlink carriers at different frequencies and/or (ii) transmit multiple uplink signals to one or more cells on multiple uplink carriers. For intra-band carrier aggregation, the transmissions are sent on different carriers in the same band. For inter-band carrier aggregation, the transmissions are sent on multiple carriers in different bands. Those skilled in the art will understand, however, that aspects described herein may be implemented in systems, devices, and/or architectures that do not support carrier aggregation.

Figure 4:
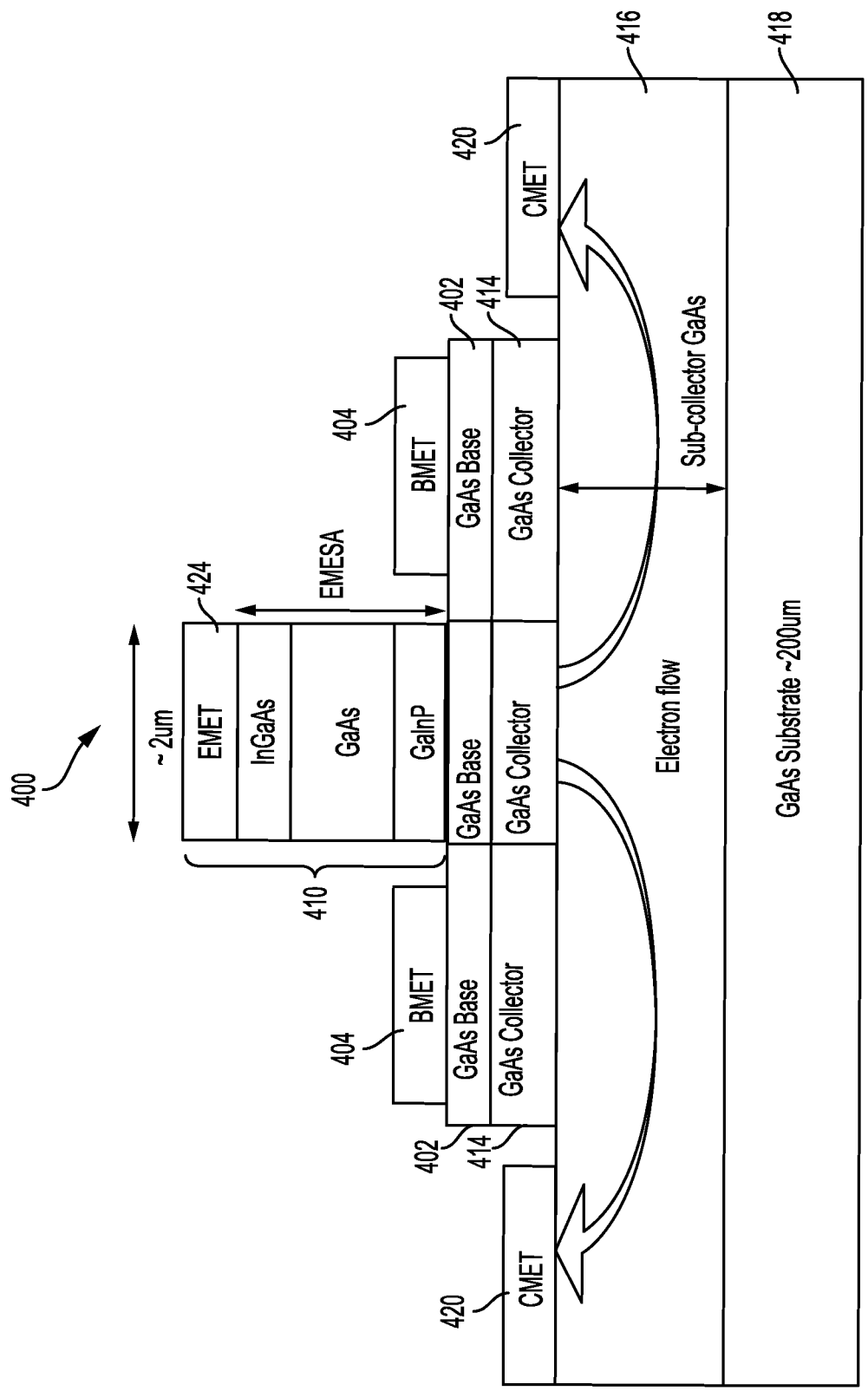
FIG. 4 illustrates an example of a heterojunction bipolar transistor (HBT) device.

FIG. 4 illustrates an example of a gallium arsenide (GaAs) based heterojunction bipolar transistor (HBT) device 400. The GaAs based HBT device 400 may include an emitter 410, a base 402 contacting the emitter 410, a collector 414 contacting the base 402, and a sub-collector 416 contacting the collector 414 and collector contacts 420. The emitter 410 is coupled to an emitter contact 424 (e.g., a front-side emitter contact) and the base 402 is coupled to base contacts 404. The sub-collector 416 may be supported by a compound semiconductor substrate 418.

The emitter 410 may be composed of indium gallium arsenide (InGaAs), gallium arsenide (GaAs), and/or gallium indium phosphide (GaInP). The base 402, the collector 414, and the sub-collector 416 may each be composed of gallium arsenide (GaAs). These materials are exemplary only, and other materials may be used.

According to an aspect of the present disclosure, the sub-collector 416 may be composed of a III-V compound semiconductor material or a II-VI compound semiconductor material. These compound semiconductor materials may include, but are not limited to, gallium arsenide (GaAs), indium phosphide (InP), gallium nitride (GaN), gallium stibium (GaSb), gallium phosphide (GaP), indium gallium arsenide (InGaAs), aluminum gallium arsenide (AlGaAs), indium gallium phosphide (InGaP), aluminum gallium phosphide (AsGaP), aluminum gallium stibium (AlGaSb), indium gallium stibium (InGaSb), indium gallium nitride (InGaN), aluminum gallium nitride (AlGaN), indium gallium arsenide phosphide (InGaAsP), indium gallium arsenide stibium (InGaAsSb), or indium gallium arsenide:nitride (InGaAs:N). These are exemplary only, and other materials are possible.

Aspects of the present disclosure describe integrating a heterojunction bipolar transistor (e.g., SiGe HBT) device on radio frequency (RF) wafers of different sizes as illustrated in the following figures.

Figure 5:
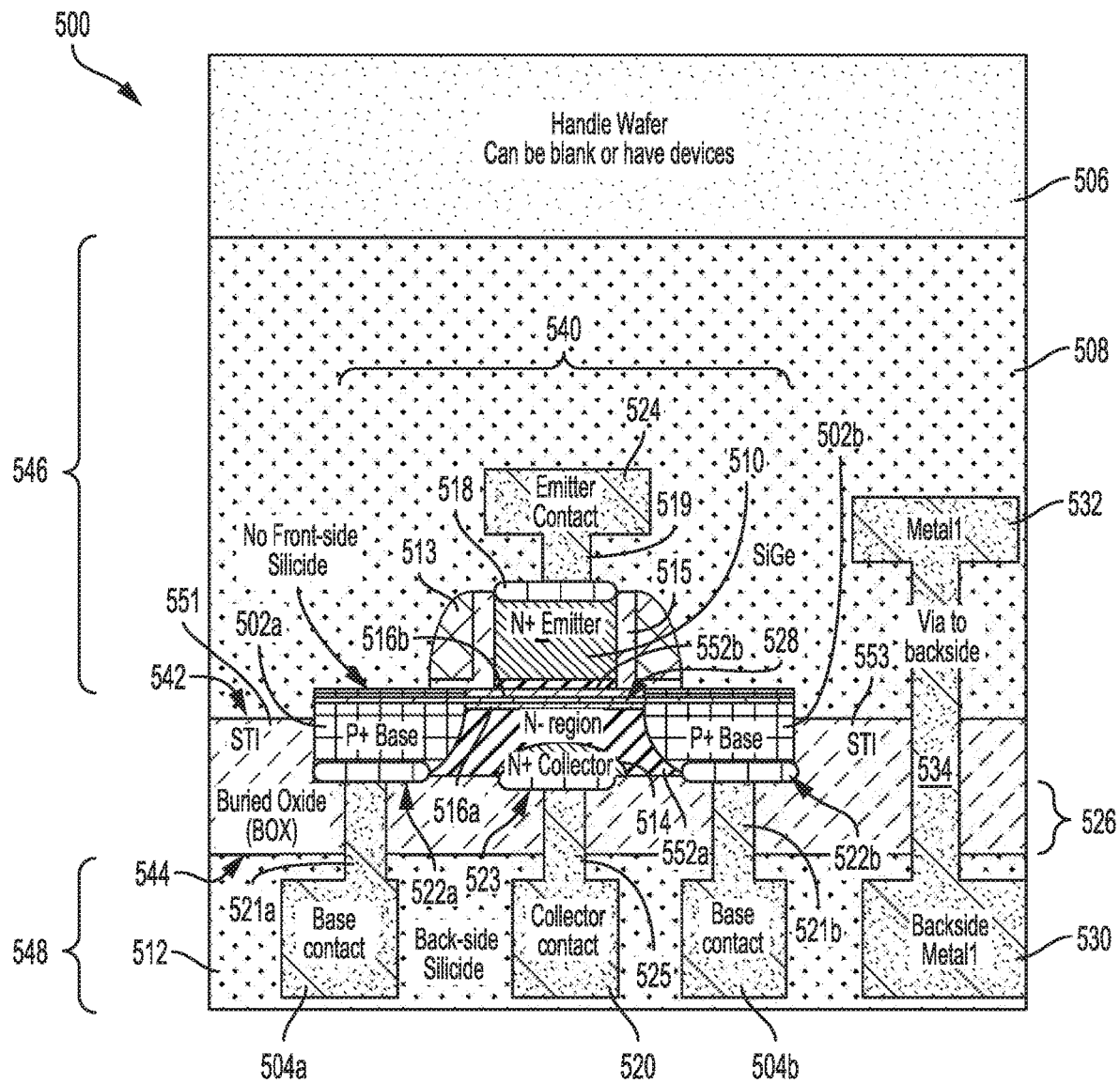
FIG. 5 illustrates a radio frequency silicon-on-insulator (SOI) integrated heterojunction bipolar transistor (HBT), according to aspects of the present disclosure.

FIG. 5 illustrates a radio frequency silicon-on-insulator (SOI) integrated heterojunction bipolar transistor (HBT) 500 (e.g., SiGe HBT), according to aspects of the present disclosure. The SOI integrated HBT 500 includes an active device 540 that is accessible from both a front-side surface 542 and a backside surface 544 of an isolation layer 526 (e.g., a buried oxide (BOX) layer). The active device 540 may be formed, for example, by one or more semiconductor manufacturing processes applied to a starting substrate layer (e.g., an SOI substrate layer). The starting SOI substrate layer may be a thick (e.g., up to two micrometers) or thin (down to twenty nanometers) SOI substrate layer.

The SOI integrated HBT 500 includes a handle wafer 506, a front-side dielectric layer 508, a backside dielectric layer 512, the isolation layer 526, the active device 540, a front-to-back contact that includes a front-side conductive contact 532, a through via 534 and a backside conductive contact 530, and shallow trench isolation (STI) regions 551 and 553. The through via 534 may be fabricated by depositing a front-side contact material and/or a backside contact material (e.g., copper (Cu)) to electrically couple a first side (e.g., a front-side 546) of the isolation layer 526 and a second side (e.g., a backside 548) of the isolation layer 526.

As described, the side of the SOI integrated HBT 500 that is between the handle wafer 506 and the isolation layer 526 is referred to as the front-side 546. The opposite side of the front-side 546, which includes portions of the active device 540 (e.g., base contacts 504 and a collector contact 520), is referred to as the backside 548. Accordingly, the SOI integrated HBT 500 may also include front-side middle-end-of-line (MEOL)/back-end-of-line (BEOL) layers (F-MEOL/F-BEOL) that are formed on the front-side 546 and backside MEOL/BEOL layers (B-MEOL/B-BEOL) that are formed on the backside 548.

The active device 540 includes a first portion 552a of a first N-type region (N−) 552, a second N-type (N+) region 514 (or N+ collector), a base 502 (502a and 502b), and an emitter 510. The first N-type region (N−) 552 may be a diffusion region. In one aspect, the second N-type (N+) region 514 may be formed in the diffusion region. At least one of or a combination of the first N-type region (N−) 552 and second N-type (N+) region 514 form the collector of the active device 540. The base 502, which includes a first section 502a and a second section 502b, may be formed by multiple processes. For example, the base 502 of the SOI integrated HBT 500 may be deposited in accordance with a selective base epitaxy. In some aspects, the SOI integrated HBT 500 may be asymmetric such that the base 502 is on a single side or section (e.g., the first section 502a or the second section 502b).

In some aspects, a P+ implant may be used to form the base 502. At least a portion of the base 502 may be disposed within the front-side dielectric layer 508. The emitter 510 may be deposited in accordance with emitter deposition and/or epitaxy. The emitter 510 may be formed from emitter patterning using a heterojunction bipolar transistor specific mask. The second N-type (N+) region 514 may be between the first base section 502a and the second base section 502b. At least a portion of the base 502 is between the second N-type (N+) region 514 and the emitter 510. In some aspects, the first N-type region is less doped than the second N-type region.

In some aspects, a silicon layer 516 and a silicon germanium layer 528 may be disposed between the first base section 502a and the second base section 502b. For example, a selective base epitaxy process may grow the silicon layer 516 (which is split into a first silicon layer 516a and a second silicon layer 516b) and the silicon germanium layer 528 between the first portion 552a of the first N-type (N−) region 552 and a second portion 552b of the first N-type (N−) region 552. For example, the silicon germanium layer 528 may be disposed between the P+ implants of the base 502 in the region of the front-side dielectric layer 508. The silicon germanium layer 528 may extend from the first base section 502a, through the silicon layer 516 to the second base section 502b.

The silicon germanium layer 528 and the silicon layer 516 between the emitter 510 and the first N-type region 552 form a compound semiconductor layer between the collector (e.g., N+ collector 514) and the emitter 510. This configuration creates a carrier (e.g., current) path between the N+ collector 514 and the emitter 510. This path is a direct path and a reduced resistance path between the N+ collector 514 and the emitter 510.

The SOI integrated HBT 500 also includes base contacts 504 (e.g., a first base contact 504a and a second base contact 504b) and the collector contact 520. In some aspects, the base contacts 504 are disposed on the backside 548 of the SOI integrated HBT 500 to provide access to the active device 540 from the backside 548. The base contacts 504 may be formed from middle-end-of-line (MEOL)/back-end-of-line (BEOL) interconnects coupled to the base 502 of the active device 540.

For example, the base contact 504a is coupled to the first base section 502a of the base 502 through a first backside contact 522a (e.g., a first backside silicide layer) and a first base via 521a. The base contact 504b is coupled to the second base section 502b through the second backside contact 522b (e.g., a second backside silicide layer) and a second base via 521b. The first backside contact 522a is positioned between a surface of the first base section 502a and the first base via 521a. The second backside contact 522b is positioned between a surface of the second base section 502b and the second base via 521b.

The collector contact 520 is disposed on the backside 548 of the SOI integrated HBT 500 to provide access to the active device 540 from the backside 548. The collector contact 520 may be formed from middle-end-of-line (MEOL)/back-end-of-line (BEOL) interconnects coupled to the collector 514 of the active device 540. For example, the collector contact 520 is coupled to the collector 514 through a third backside contact 523 (e.g., a third backside silicide layer) and a collector via 525. The third backside contact 523 is positioned between a surface of the collector 514 and the collector via 525.

An emitter contact 524 is disposed on the front-side 546 of the SOI integrated HBT 500. The emitter contact 524 may be formed from middle-end-of-line (MEOL)/back-end-of-line (BEOL) interconnects coupled to the emitter 510 of the active device 540. For example, the emitter contact 524 is coupled to the emitter 510 through a front-side contact 518 (e.g., a front-side silicide layer) and an emitter via 519. The front-side contact 518 is positioned between a surface of the emitter 510 and the emitter via 519. Spacers 513 may be formed around the emitter 510. Isolation regions 515 may be disposed between the spacers 513 and the emitter 510 and/or between the spacers 513 and base 502 and/or the silicon layer 516. The spacers 513 may be formed by deposition and etching processes.

Figure 6:
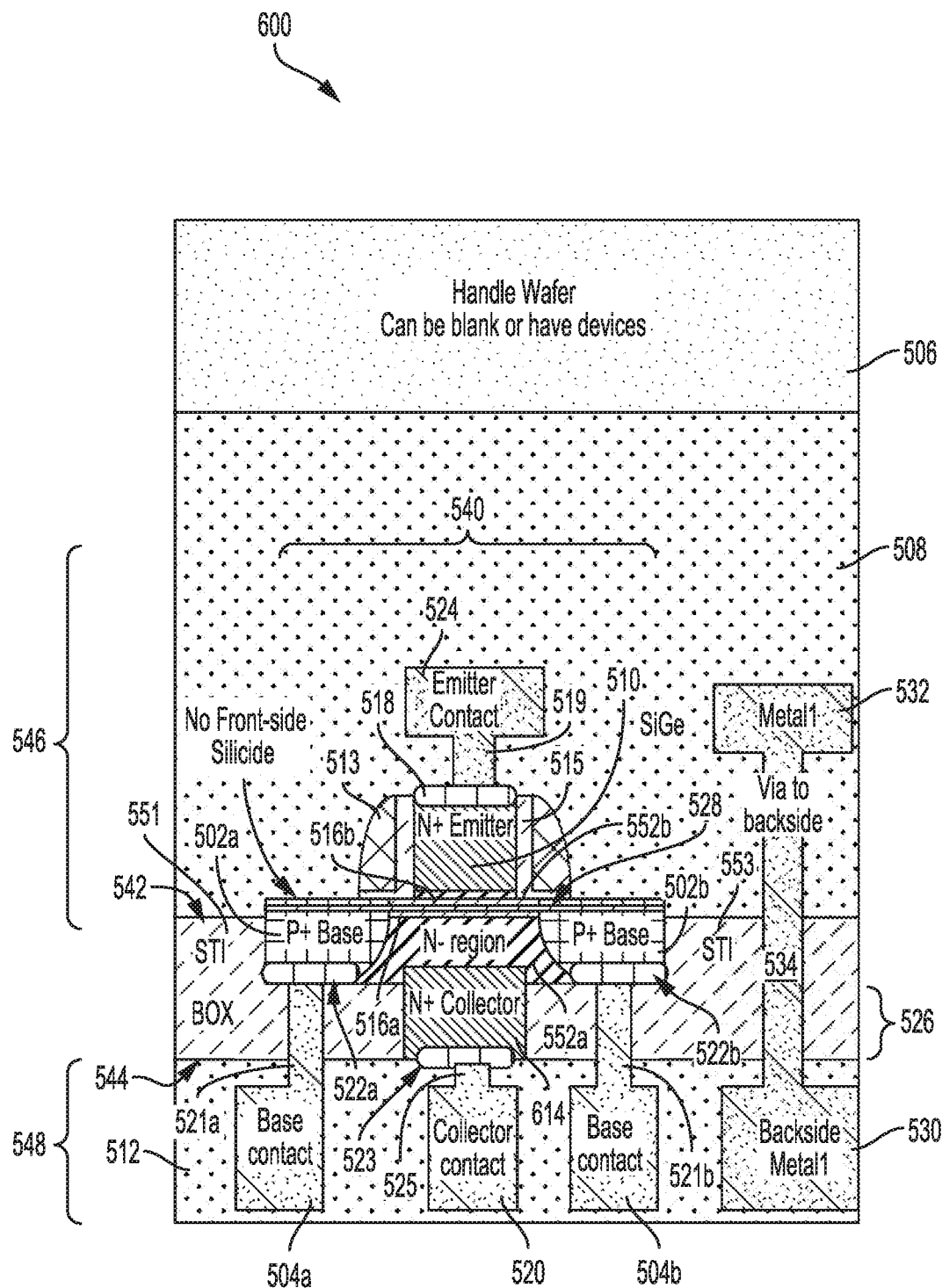
FIG. 6 illustrates a radio frequency silicon-on-insulator (SOI) integrated heterojunction bipolar transistor (HBT), according to aspects of the present disclosure.

FIG. 6 illustrates a radio frequency silicon-on-insulator (SOI) integrated heterojunction bipolar transistor (HBT) 600, according to aspects of the present disclosure. For illustrative purposes, some of the labelling and numbering of the devices and features of FIG. 6 are similar to those of the FIG. 5. While the second N-type (N+) region 514 (or N+ collector) of FIG. 5 is formed in an SOI substrate layer, an N-type region 614 for the collector in FIG. 6 is formed in the isolation layer 526 by an ion implantation process, which avoids a mask for the N+ collector 514. However, the first N-type (N−) region 552 of FIGS. 5 and 6 are formed in the SOI substrate by, for example, epitaxial growth, because the first N-type (N−) region 552 does not have to be extra thin.

Figure 7:
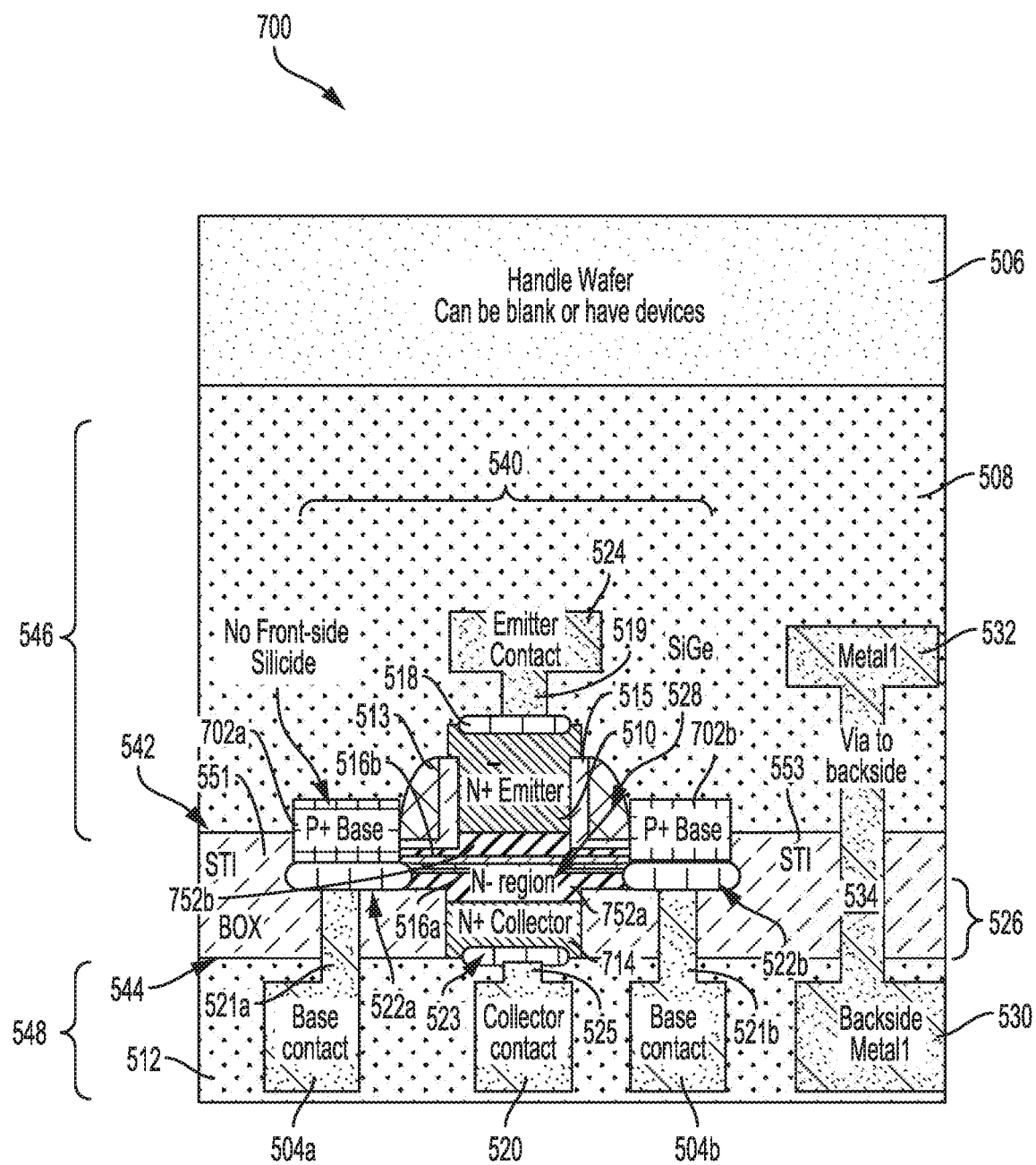
FIG. 7 illustrates a radio frequency silicon-on-insulator (SOI) integrated heterojunction bipolar transistor (HBT), according to aspects of the present disclosure.

FIG. 7 illustrates a radio frequency silicon-on-insulator (SOI) integrated heterojunction bipolar transistor (HBT) 700, according to aspects of the present disclosure. For illustrative purposes, some of the labelling and numbering of the devices and features of FIG. 7 are similar to those of the FIGS. 5 and 6. This aspect may be used when the starting substrate (e.g., SOI substrate) for forming the active device 540 is thin, for example 250 Angstroms or less. In some aspects, the base for the SOI integrated HBT 700 is a raised base 702. The base may be raised such that at least a portion of the raised base 702 is on a same layer as the emitter 510 and the raised base 702 and the emitter 510 are both formed within the front-side dielectric layer 508. For example, the base 702 includes a first section 702a and a second section 702b that are epitaxially grown to form the raised base. The base 702 is raised such that the first section 702a and the second section 702b protrude into the first-side 546 relative to the base 502 of FIG. 5. Similarly, a first portion 752a and a second portion 752b of the first N-type (N−) region 752 may also be epitaxially grown. For example, the epitaxially grown first portion 752a of the first N-type (N−) region 752 may protrude into the isolation layer 526. Thus, the first portion 752a of the first N-type (N−) region 752 is formed within the isolation layer 526. A second N-type (N+) region 714 for the collector of FIG. 7 may also be epitaxially grown such that it protrudes into the isolation layer 526. Thus, at least a portion of the second N-type (N+) region 714 is formed within the isolation layer 526.

Figure 8:
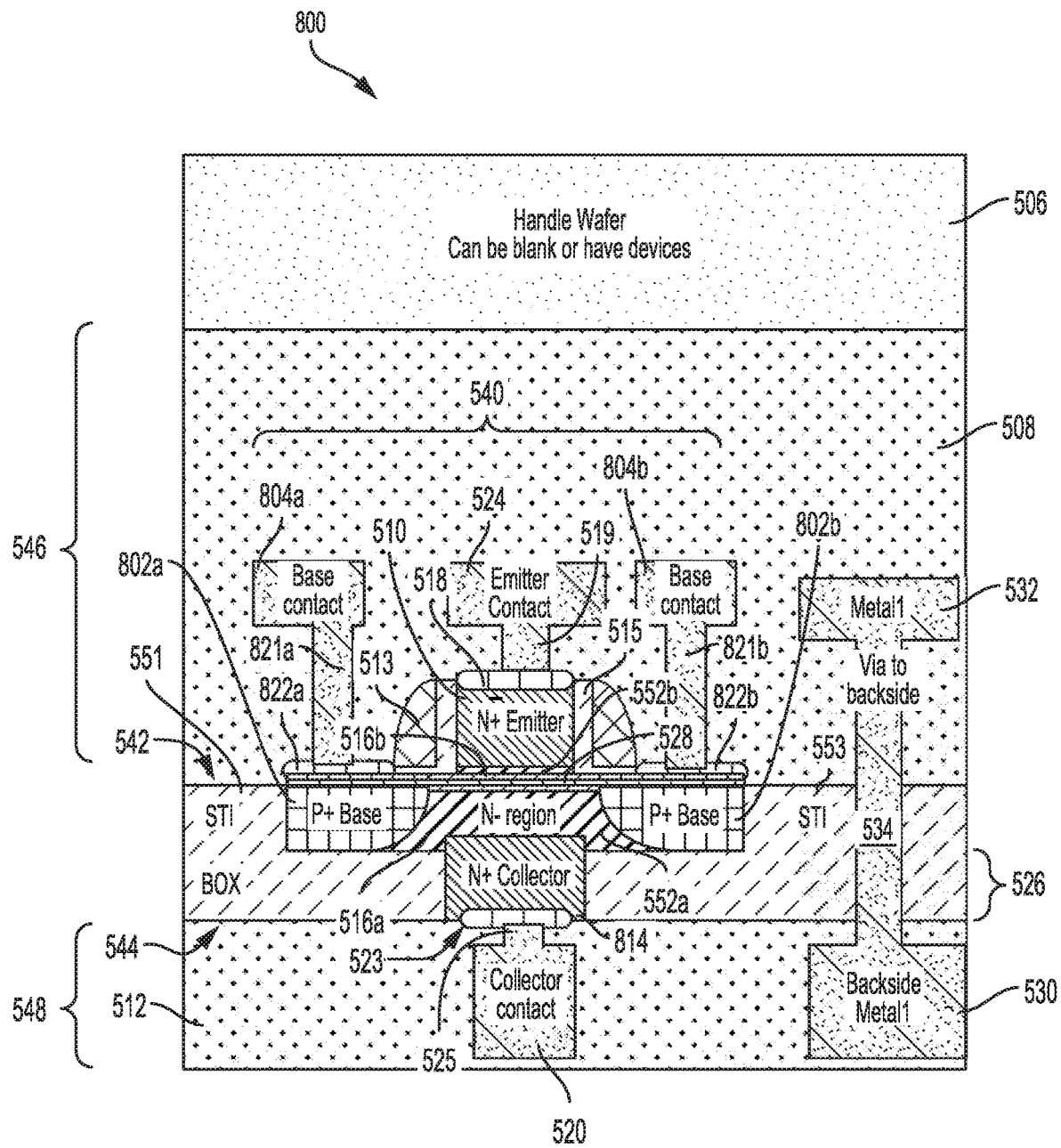
FIG. 8 illustrates a radio frequency silicon-on-insulator (SOI) integrated heterojunction bipolar transistor (HBT), according to aspects of the present disclosure.

FIG. 8 illustrates a radio frequency silicon-on-insulator (SOI) integrated heterojunction bipolar transistor (HBT) 800, according to aspects of the present disclosure. For illustrative purposes, some of the labelling and numbering of the devices and features of FIG. 8 are similar to those of the FIGS. 5, 6, and 7. For example, FIG. 8 is similar to FIG. 6 with the difference being that a first section 802a and a second section 802b of the base 802 is accessible from the front-side 546.

In this aspect, a base contact 804a is coupled to the first base section 802a through a first front-side contact 822a (e.g., a first front-side silicide layer) and a first base via 821a. A base contact 804b is coupled to the second base section 802b through a second front-side contact 822b (e.g., a second front-side silicide layer) and a second base via 821b. The first front-side contact 822a is positioned between a surface of the first base section 802a and the first base via 821a. The second front-side contact 822b is positioned between a surface of the second base section 802b and the second base via 821b.

FIGS. 9A, 9B, 9C, 9D, 9E, 9F, 9G, and 9H are exemplary diagrams illustrating stages of a first method of fabricating radio frequency (RF) silicon-on-insulator (SOI) integrated heterojunction bipolar transistors, according to an aspect of the present disclosure. The stages of the first fabrication method are shown as cross-sectional views of formation of the SOI integrated HBT 500. For illustrative purposes, some of the labelling and numbering of the devices and features of FIGS. 5, 6, 7, and 8 are similar to those of the FIGS. 9A, 9B, 9C, 9D, 9E, 9F, 9G, and 9H.

The radio frequency (RF) silicon-on-insulator (SOI) integrated heterojunction bipolar transistor may be formed, for example, by one or more semiconductor manufacturing processes. For example, one or more etching processes, doping processes, planarization processes, deposition processes, epitaxial growth processes, etc., may be applied to an SOI substrate layer (and any additional layers formed on the SOI substrate layer) to form the SOI integrated HBT 500. The processes may also include active device definition, channel implants, dummy gate formation, source-drain or collector-base formation, and n-gate formation.

Figure 9A:
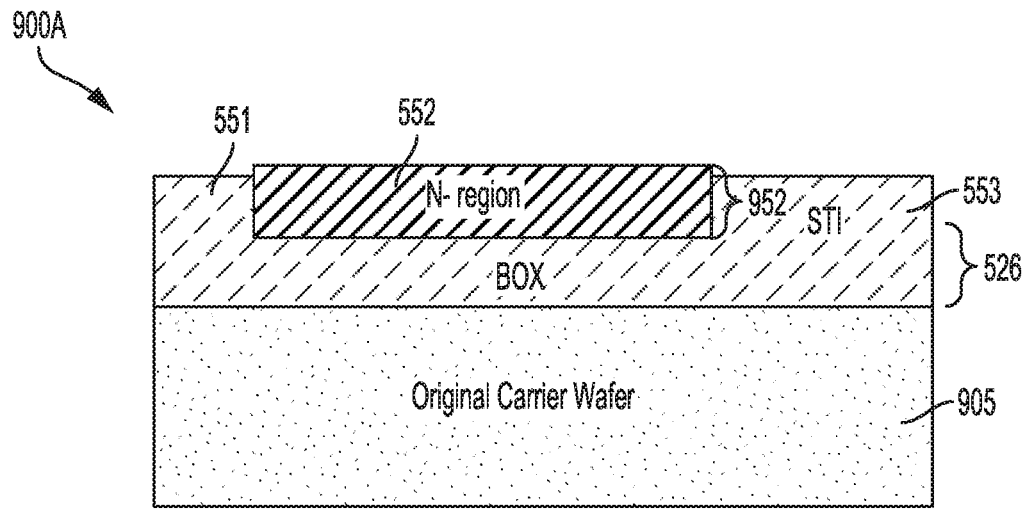
FIGS. 9A, 9B, 9C, 9D, 9E, 9F, 9G, and 9H are exemplary diagrams illustrating stages of a first method of fabricating radio frequency (RF) silicon-on-insulator (SOI) integrated heterojunction bipolar transistors, according to an aspect of the present disclosure.

Referring to FIG. 9A, a first stage of the first fabrication process is depicted and generally designated 900A. An SOI integrated HBT may be formed, for example, by one or more semiconductor manufacturing processes. For example, one or more etching processes, doping processes, planarization processes, deposition processes, epitaxial growth processes, etc., may be applied to a first silicon on insulator (SOI) substrate layer 952 (and any additional layers formed on the first SOI substrate layer 952) to form at least a portion of the RF SOI integrated heterojunction bipolar transistor and to remove at least a portion of the first SOI substrate layer 952.

The first stage includes the first silicon on insulator (SOI) substrate layer 952, and the isolation layer 526. The first SOI substrate layer 952 may be the substrate layer on which the active device 540 is formed. The first SOI substrate layer 952, and the isolation layer 526, may be included in a wafer, a die, or another chip or device upon which semiconductor fabrication may be performed. The first SOI substrate layer 952 and the isolation layer 526 may be supported by an original carrier wafer 905.

Fabrication of a semiconductor device (e.g., the HBT) may be initiated and continued in accordance with a complementary metal oxide semiconductor (CMOS) fabrication process until after a formation of a semiconductor element such as a gate. In one aspect, a front-end-of-line (FEOL) implementation in accordance with the CMOS fabrication process is performed on the first SOI substrate layer 952 until right after the gate formation. For example, as part of the fabrication process to form the HBT, the first SOI substrate layer 952 may be doped with an N-type dopant in accordance with an implantation process. The implantation may be performed to form a collector within the first SOI substrate layer 952. In one aspect, a first mask may be used for the implantation process. The first mask may be an HBT specific mask. A first N-type (N−) region 552 may be formed within the first SOI substrate layer 952 as a result of the implantation. For example, the first N-type (N−) region 552 may be part of the collector of the HBT.

In one aspect of the present disclosure, opposite sides of the first SOI substrate layer 952 include isolation regions (e.g., a first shallow trench isolation (STI) region 551 and a second STI region 553). The isolation regions may include a same or different isolation material as the isolation layer 526.

Figure 9B:
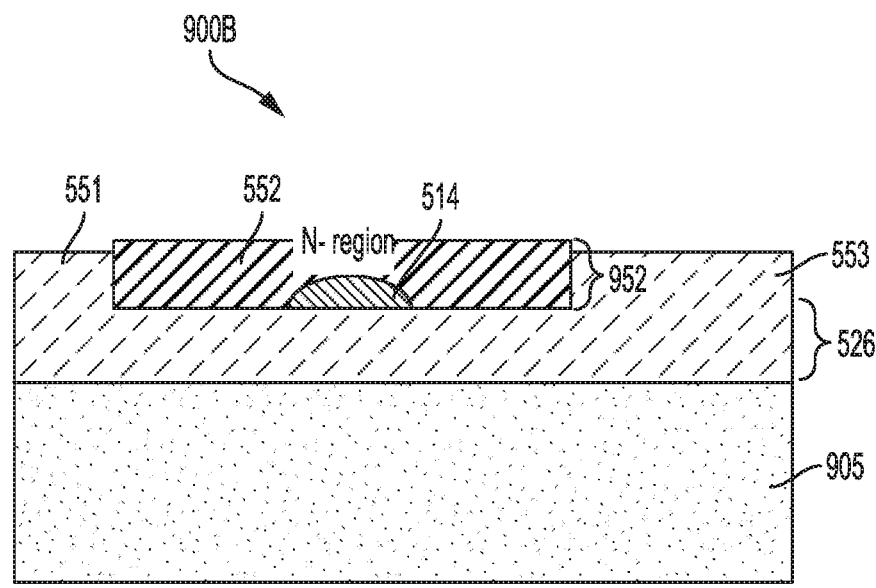

Referring to FIG. 9B, a second stage of the first fabrication process is depicted and generally designated 900B. As part of the fabrication process to form the HBT, a portion of the first SOI substrate layer 952 may be further doped with the N-type dopant in accordance with an implantation process. The doping may be performed to achieve a collector with a higher doping within the first SOI substrate layer 952. As a result of the increased doping, a second N-type (N+) region 514 may be formed on the first SOI substrate layer 952. For example, the first N-type (N−) region 552 and the second N-type (N+) region 514 may collectively form the collector of the HBT. CMOS areas are protected as part of the fabrication process for the HBT. The first N-type (N−) region 552 and the second N-type (N+) region 514 is specific to the HBT.

Figure 9C:
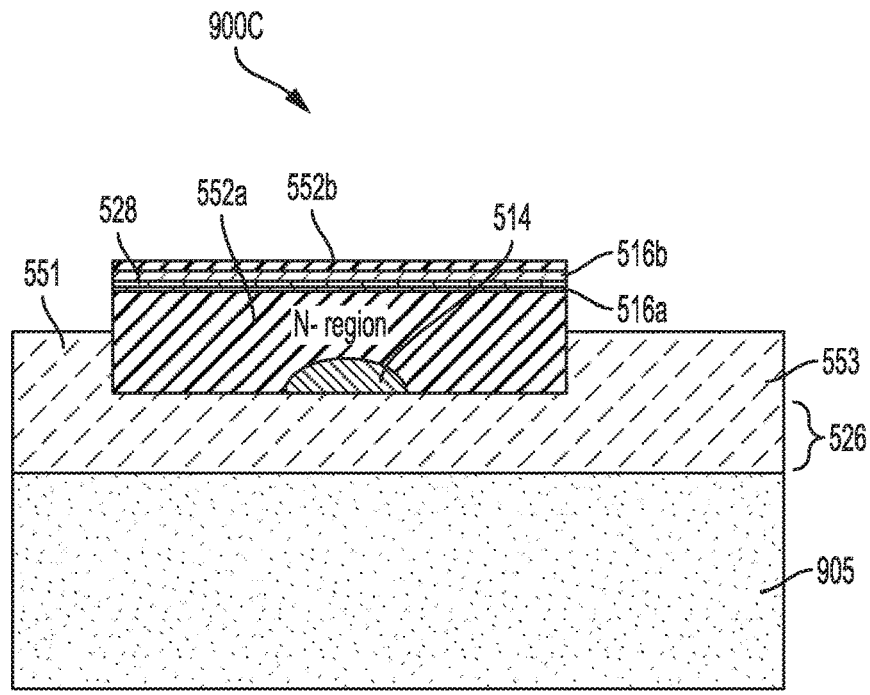

Referring to FIG. 9C, a third stage of the first fabrication process is depicted and generally designated 900C. A second mask (e.g., another HBT specific mask) may be used to open the region specific to the HBT. Selective base epitaxy may grow the silicon layer 516 (which is split into a first silicon layer 516a and a second silicon layer 516b) and the silicon germanium (SiGe) layer 528 between the first N-type (N−) region 552 (which is split into the first portion 552a and the second portion 552b). Multiple layers (e.g., a compound semiconductor layer) can be created in an order including the first portion 552a of the first doped N− region 552, followed by the first silicon layer 516a, followed by the SiGe layer 528, followed by the second silicon layer 516b, followed by the second portion 552b of the first N− region 552. Charge between the emitter 510 and the second N-type (N+) region 514 of the HBT may traverse the multiple layers to provide a direct carrier path between the emitter 510 and the second N-type (N+) region 514.

Figure 9D:
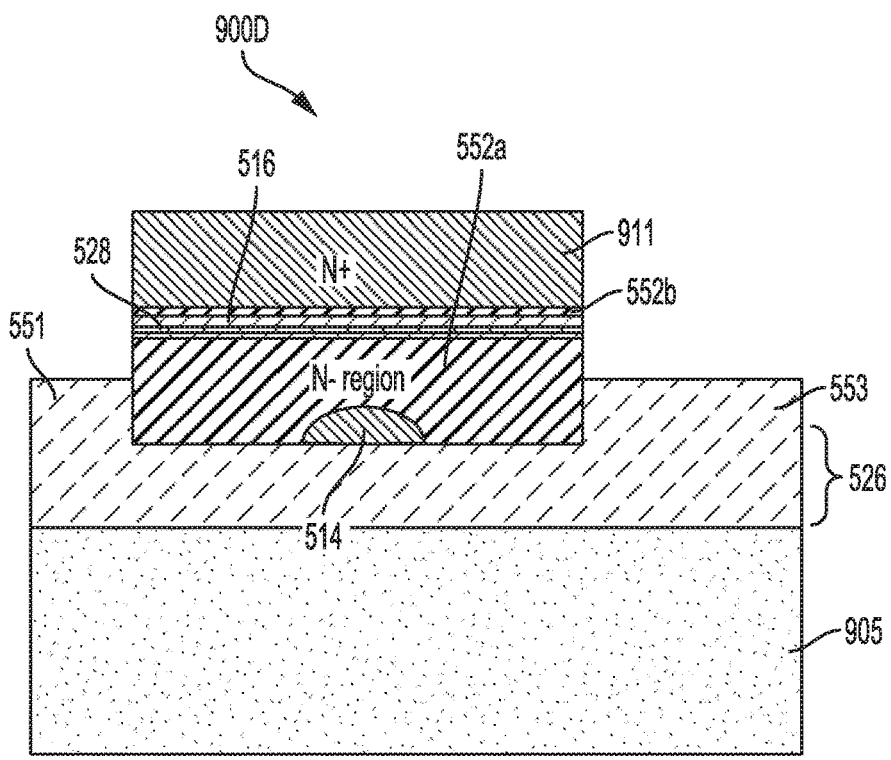

Referring to FIG. 9D, a fourth stage of the first fabrication process is depicted and generally designated 900D. An epitaxial growth process may grow a third N-type (N+) region 911 for the emitter 510. Alternatively, the third N-type (N+) region 911 may be formed by an emitter deposition process.

Figure 9E:
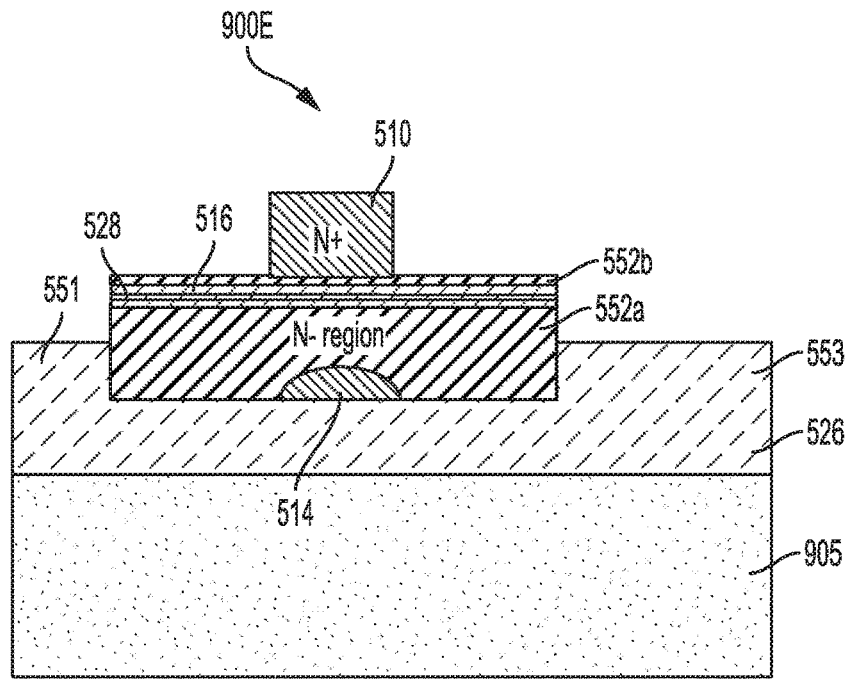

Referring to FIG. 9E, a fifth stage of the first fabrication process is depicted and generally designated 900E. The emitter 510 may be formed from emitter patterning. For example, the third N-type (N+) region 911 may be patterned using a third mask, such as a heterojunction bipolar transistor specific mask, to form the emitter 510.

Figure 9F:
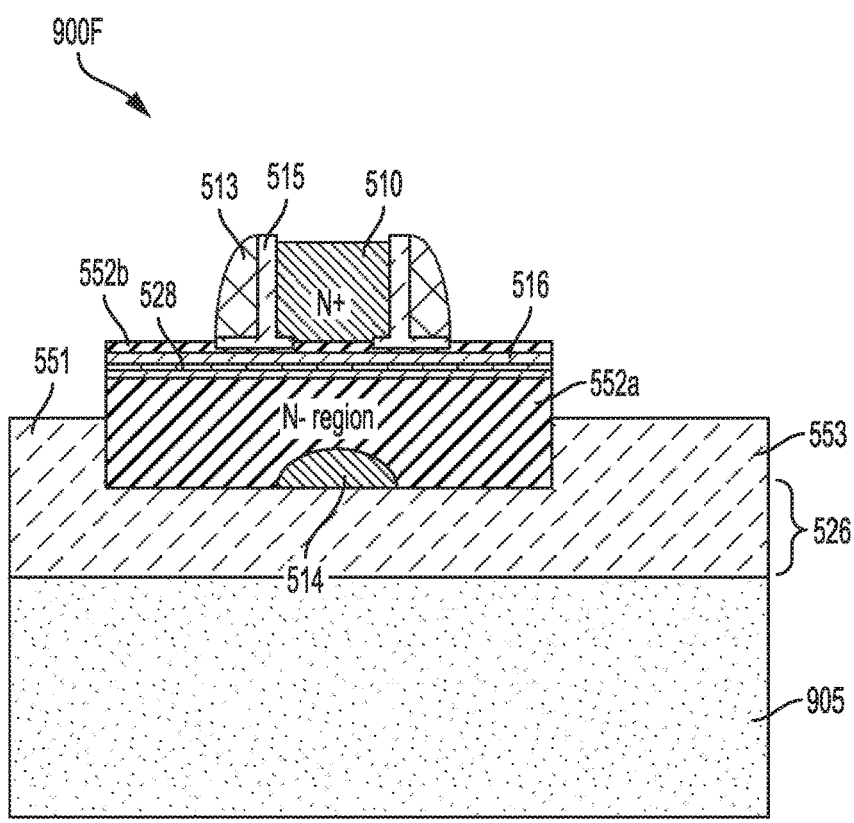

Referring to FIG. 9F, a sixth stage of the first fabrication process is depicted and generally designated 900F. Spacers 513 may be formed around the emitter 510. Isolation regions 515 may be disposed between the spacers 513 and the emitter 510 and/or between the spacers 513 and the second portion 552b of the first N− region 552 or the silicon layer 516. Lightly doped regions may be created in accordance with the CMOS process. For example, the lightly doped regions formed by the CMOS process are source and drain implants (e.g., CMOS lightly doped drain modules) with doping concentrations that are very low. In some aspects, these lightly doped regions can form the base 502 of the active device 540 of FIG. 5.

Figure 9G:
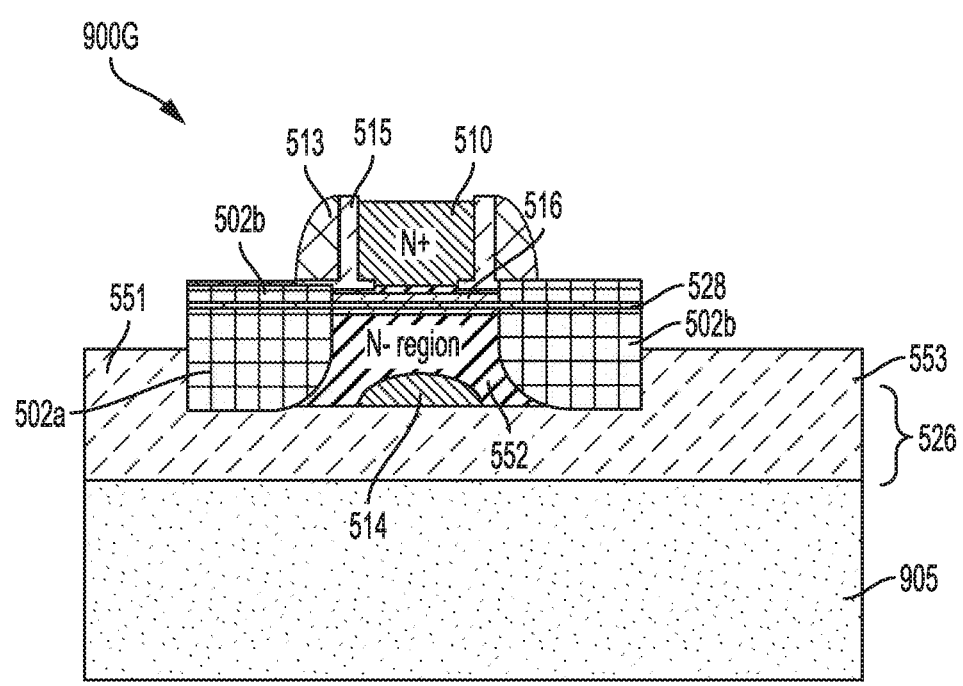

Referring to FIG. 9G, a sixth stage of the first fabrication process is depicted and generally designated 900G. The base 502, which includes the first section 502a and the second section 502b, may be formed by multiple processes. For example, the base 502 (e.g., a HBT P+ base) may be formed by tilted P-type (P+) implantation. Alternatively, the base 502 may be formed using the lightly doped regions. For example, the base 502 may be formed using CMOS P+ source-drain implantation. The base 502 may be implanted on opposite ends of the first N− region 552 and/or opposite ends of the silicon layer 516. However, the silicon germanium layer 528 traverses the base 502. For example, a portion of the silicon germanium layer 528 is disposed between the first base section 502a and the second base section 502b.

Figure 9H:
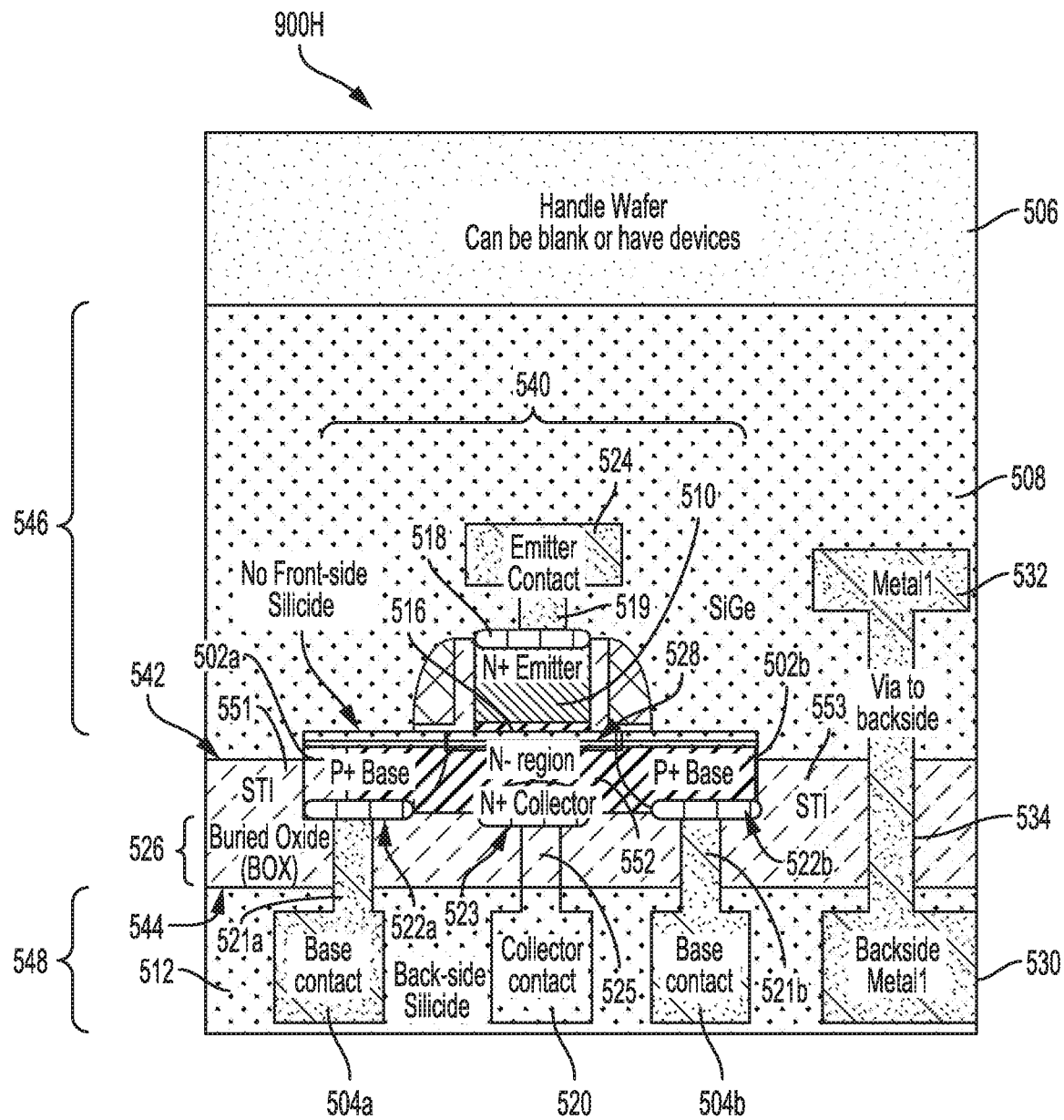

Referring to FIG. 9H, a seventh stage of the first fabrication process is depicted and generally designated 900H. For illustrative purposes, the labelling and numbering of the devices and features of FIG. 5 are similar to those of FIG. 9H. For example, source/drain anneals may be performed as part of the fabrication process for the base 502. The first fabrication process then continues with middle-end-of-line (MEOL) and back-end-of-line (BEOL) processes, similar to the processes illustrated with respect to FIG. 5.

While a front-end-of-line (FEOL) process (e.g., of the CMOS process) forms the active devices, such as transistors, the overall process may further include MEOL and BEOL processes. For example, the FEOL process includes some of the processes described herein in addition to other processes such as ion implantation, anneals, oxidation, chemical vapor deposition (CVD), atomic layer deposition (ALD), etch, chemical mechanical polishing (CMP), and epitaxy.

The MEOL process may be performed to enable connection of the transistor (e.g., the collector, the base, and the emitter of the active device 540) to a BEOL interconnect. This process involves silicidation and contact formation as well as stress introduction. The BEOL process is the set of process steps that form the BEOL interconnects that tie the independent transistors and form circuits.

For example, MEOL and front-side BEOL processes may be performed to form the emitter via 519, the emitter contact 524, and the front-side contact 518. This process can be achieved on the front-side 546 with the support of the original carrier wafer 905. A front-side silicidation process may form the front-side contact 518.

A layer transfer process may be used to form silicide underneath the transistor (e.g., active device 540) or on the backside 548. For example, the layer transfer may include coupling the front-side 546 of the device to the handle wafer 506 while removing the original carrier wafer 905 to allow access to the backside 548. MEOL and backside BEOL processes may form a first base via 521a, a second base via 521b, a collector via 525, the collector contact 520, the first base contact 504a, the second base contact 504b, the first backside contact 522a, the second backside contact 522b, and the third backside contact 523. This processing occurs on the backside 548 with the support of the handle wafer 506. A backside silicidation process may form the first backside contact 522a, the second backside contact 522b, and the third backside contact 523. The contacts 530 and 532 and the through via 534 can also be formed by the MEOL process, the front-side BEOL process, and the backside BEOL process. Backside contacts masks, front-side contact masks and silicide masks may be used to form the contacts and vias and for the silicidation process.

Advantages of the aspects of the present disclosure include single epitaxial growth, simpler backside processing, low parasitic capacitance, very low base resistance, and very low collector resistance.

FIGS. 10A, 10B, 10C, and 10D are exemplary diagrams illustrating stages of a second method of fabricating radio frequency (RF) silicon-on-insulator (SOI) integrated heterojunction bipolar transistors (HBTs), according to an aspect of the present disclosure. The stages of the second fabrication method are shown as cross-sectional views of formation of the SOI integrated HBT 600. For illustrative purposes, some of the labelling and numbering of the devices and features of FIGS. 9A, 9B, 9C, 9D, 9E, 9F, and 9G are similar to those of the FIGS. 10A, 10B, 10C, and 10D.

While the first fabrication process of FIGS. 9A-G includes an implantation process to form the second N-type (N+) region 514 (or N+ collector) in the first SOI substrate layer 952 (which specifies a mask for the N+ collector), the second fabrication process of FIGS. 10A-D forms the N-type region for the collector in the isolation layer 526 by an ion implantation process.

Figure 10A:
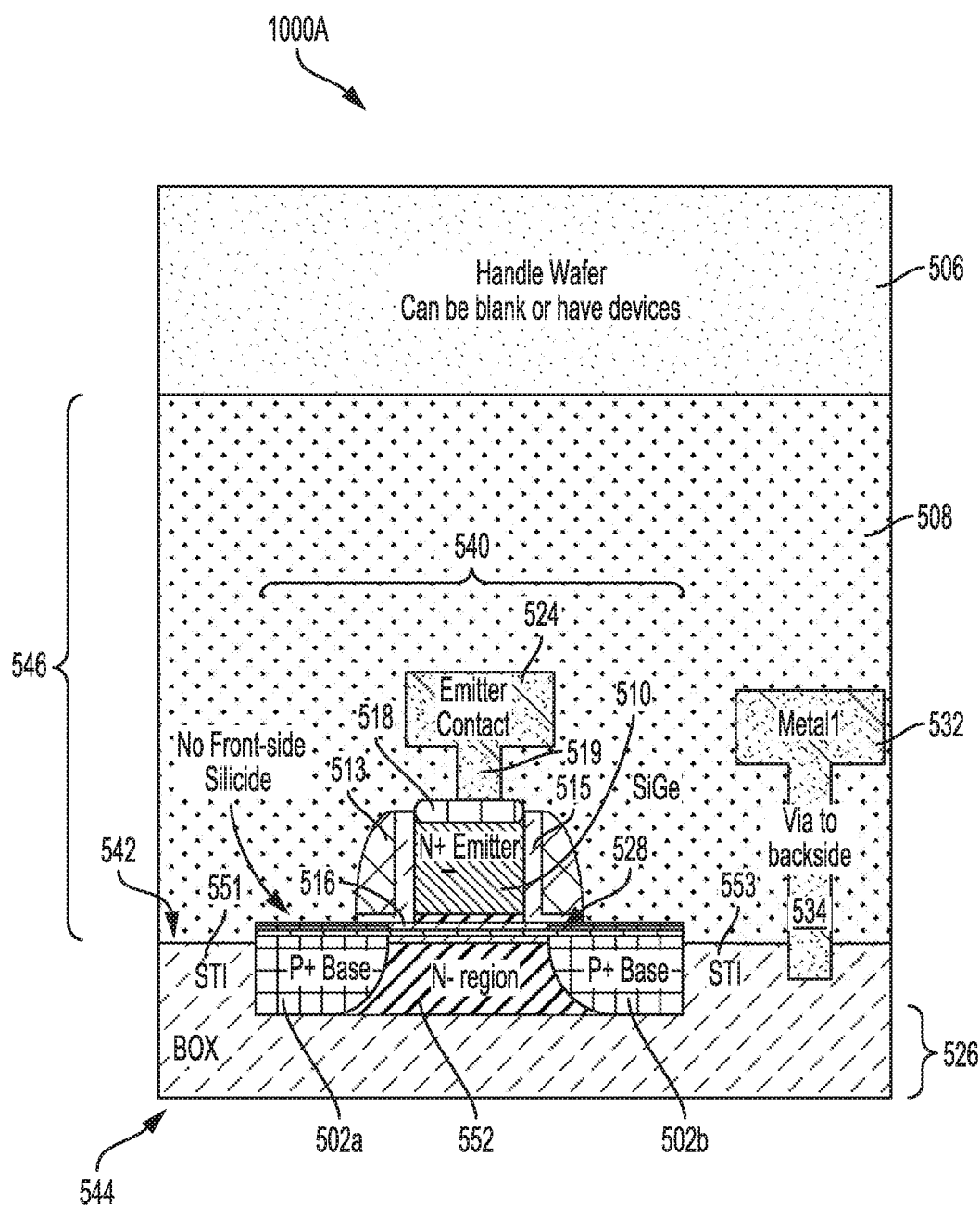
FIGS. 10A, 10B, 10C, and 10D are exemplary diagrams illustrating stages of a second method of fabricating radio frequency (RF) silicon-on-insulator (SOI) integrated heterojunction bipolar transistors, according to an aspect of the present disclosure.

Referring to FIG. 10A, a first stage of the second fabrication process is depicted and generally designated 1000A. The first SOI substrate layer 952, which includes the first N-type region (N−) 552, is free of the second N-type (N+) region 514. The first N-type region (N−) 552 may be epitaxially grown because the first N-type region (N−) 552 does not need to be extra thin.

Figure 10B:
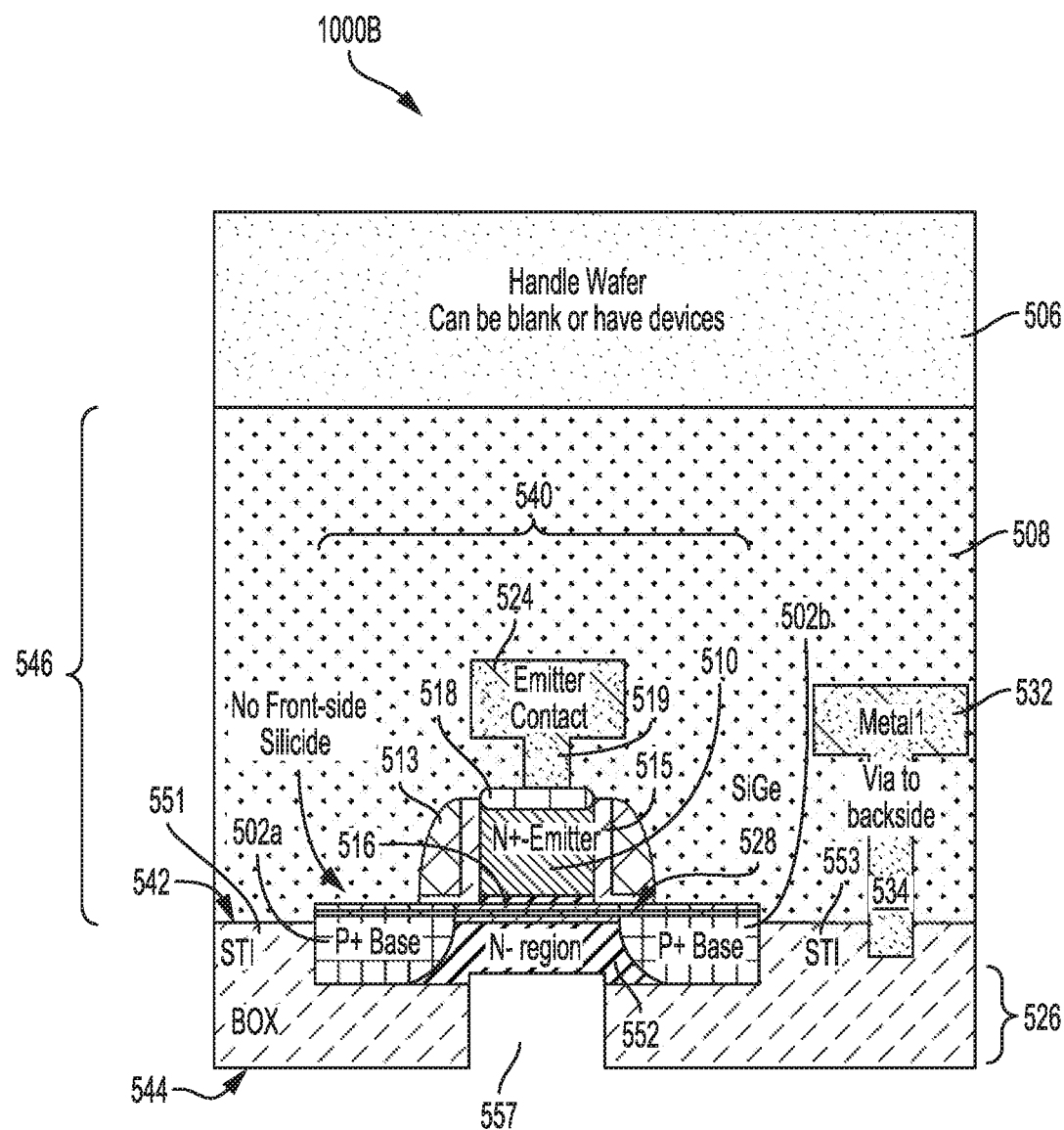

Referring to FIG. 10B, a second stage of the second fabrication process is depicted and generally designated 1000B. To form a new N-type (N+) region for the N+ collector, a collector opening 557 is formed in the isolation layer 526 using an HBT specific mask.

Figure 10C:
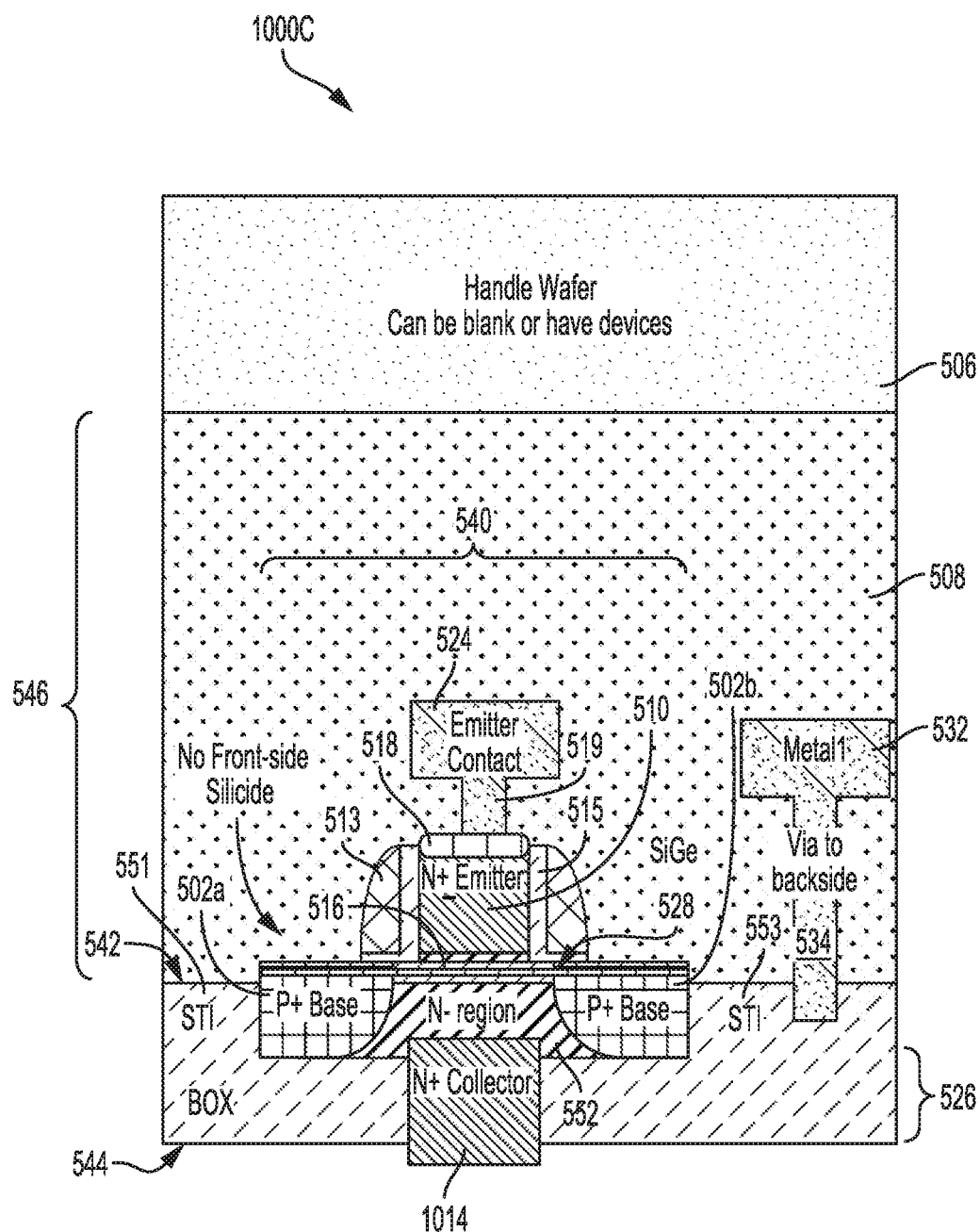

Referring to FIG. 10C, a third stage of the second fabrication process is depicted and generally designated 1000C. A new N-type (N+) region 1014 may be formed in the collector opening 557 using N+ implantation without using a special collector mask for growing the new N-type (N+) region 1014. Some patterning may be specified to form the new N-type (N+) region 1014. In some aspects, at least a portion of the new N-type (N+) region 1014 may be epitaxially grown on the backside 548 using a selective low temperature epitaxial growth process.

Figure 10D:
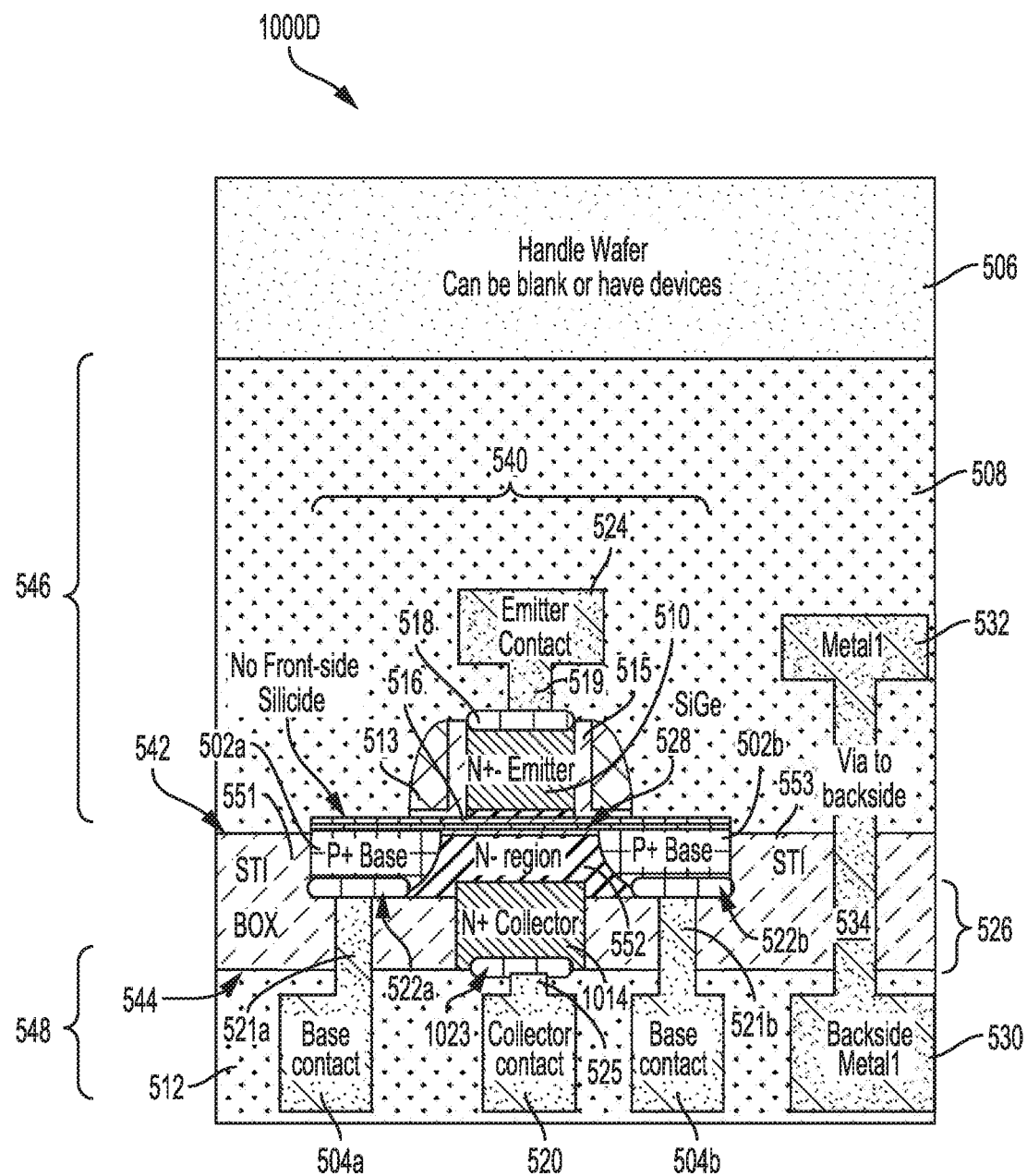

Referring to FIG. 10D, a fourth stage of the second fabrication process is depicted and generally designated 1000D. MEOL and backside BEOL processes may form the first base via 521a, the second base via 521b, the collector via 525, the collector contact 520, the first base contact 504a, the second base contact 504b, the first backside contact 522a, the second backside contact 522b and a new backside contact 1023. The new backside contact 1023 may be formed by silicidation between the collector via 525 and the new N-type (N+) region 1014.

Figure 11:
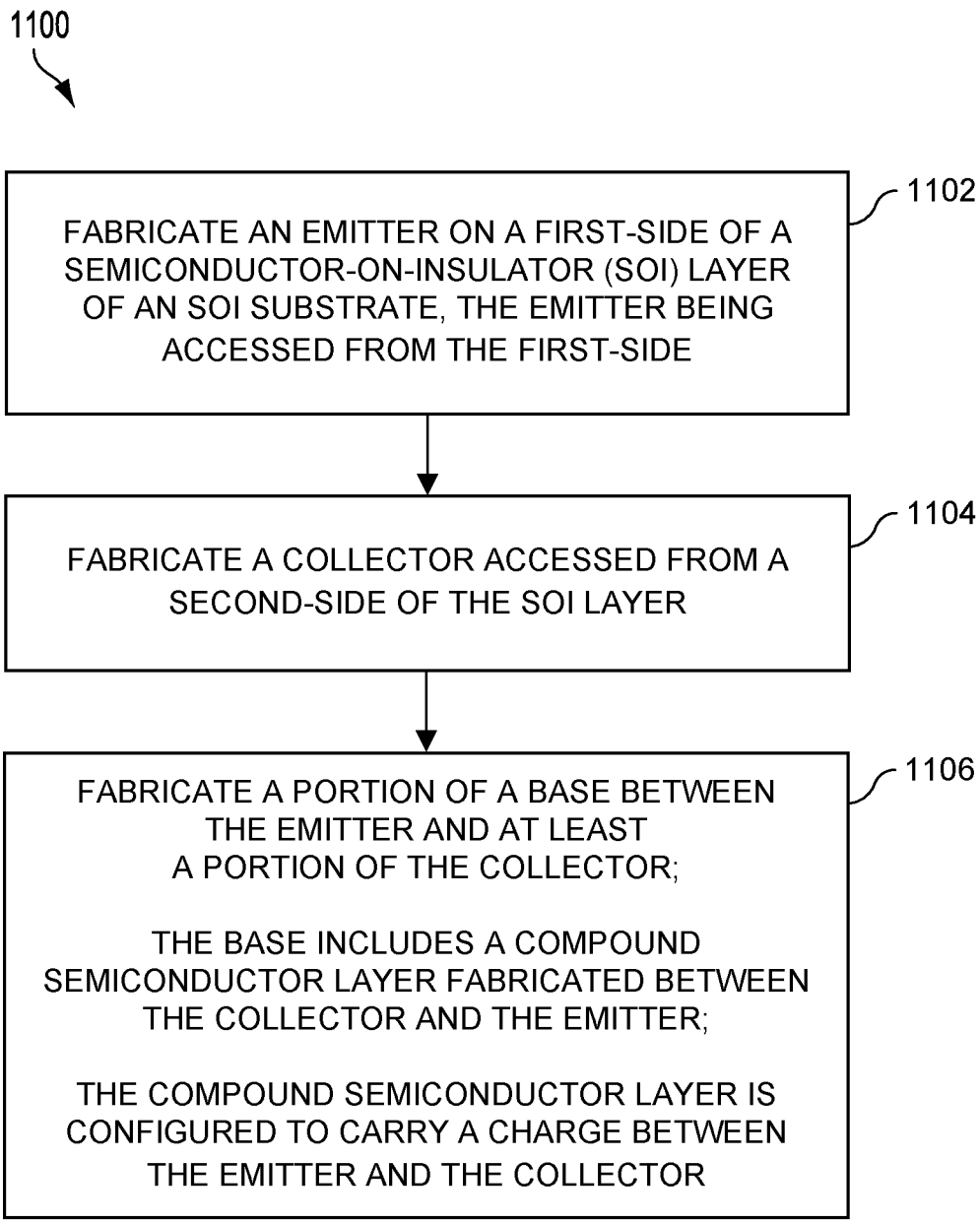
FIG. 11 illustrates a method of making a heterojunction bipolar transistor (HBT), according to aspects of the present disclosure

FIG. 11 illustrates a method 1100 of making a heterojunction bipolar transistor (HBT), according to aspects of the present disclosure. In block 1102, an emitter is fabricated on a first-side of a semiconductor-on-insulator (SOI) layer of an SOI substrate. The emitter is accessed from the first-side. For example, as shown in FIG. 9D, an emitter 510 is fabricated. In block 1104, a collector accessed from a second-side of the SOI layer is fabricated. For example, as shown in FIG. 9B, a second N-type (N+) region 514 of the collector may be formed on the first SOI substrate layer 952.

In block 1106, at least a portion of a base is fabricated between the emitter and at least a portion of the collector. For example, as shown in FIG. 9G, the base 502, which includes a first section 502a and a second section 502b, may be formed by multiple processes. The base 502 may be implanted on opposite ends of the first N-type (N−) region 552 and/or opposite ends of the silicon layer 516. The base may include a compound semiconductor layer fabricated between the collector and the emitter. The compound semiconductor layer is configured to carry a charge between the emitter and the collector. For example, selective base epitaxy may grow the silicon layer 516 (split into a first silicon layer 516a and a second silicon layer 516b) and a silicon germanium (SiGe) layer 528 between the first N-type (N−) region 552 (split into a first portion 552a and a second portion 552b).

According to a further aspect of the present disclosure, a heterojunction bipolar transistor is described. The heterojunction bipolar transistor includes means for carrying a charge between the emitter and the collector. The charge carrying means may be the silicon germanium layer 528, the silicon layer 516, and the first N-type region 552, shown in FIG. 5. In another aspect, the aforementioned means may be any module or any apparatus configured to perform the functions recited by the aforementioned means.

Figure 12:
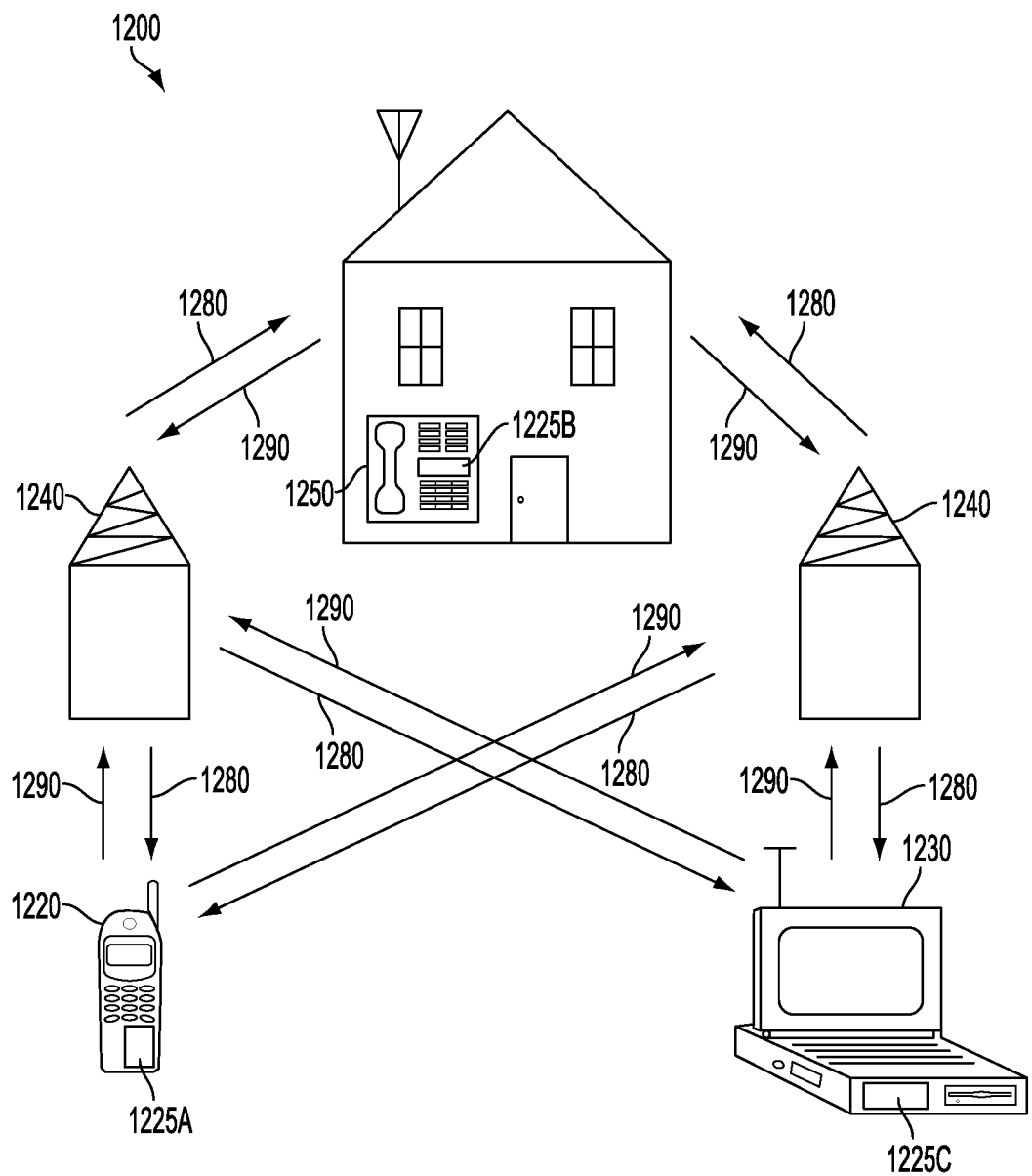
FIG. 12 is a block diagram showing an exemplary wireless communication system in which an aspect of the disclosure may be advantageously employed.

FIG. 12 is a block diagram showing an exemplary wireless communication system 1200 in which an aspect of the disclosure may be advantageously employed. For purposes of illustration, FIG. 12 shows three of the remote units 1220, 1230, and 1250 and two of the base stations 1240. It will be recognized that wireless communication systems may have many more remote units and base stations. Remote units 1220, 1230, and 1250 include IC devices 1225A, 1225C, and 1225B that include the heterojunction bipolar transistor (HBT). It will be recognized that other devices may also include the disclosed integrated heterojunction bipolar transistor, such as the base stations, switching devices, and network equipment. FIG. 12 shows forward link signals 1280 from one of the base stations 1240 to the remote units 1220, 1230, and 1250 and reverse link signals 1290 from the remote units 1220, 1230, and 1250 to base stations 1240.

In FIG. 12, one of the remote units 1220 is shown as a mobile telephone, one of the remote units 1230 is shown as a portable computer, and remote unit 1250 is shown as a fixed location remote unit in a wireless local loop system. For example, the remote units may be a mobile phone, a hand-held personal communication systems (PCS) unit, a portable data unit such as a personal digital assistant (PDA), a GPS enabled device, a navigation device, a set top box, a music player, a video player, a communications device, an entertainment unit, a fixed location data unit such as a meter reading equipment, or other devices that store or retrieve data or computer instructions, or combinations thereof. Although FIG. 12 illustrates remote units according to the aspects of the disclosure, the disclosure is not limited to these exemplary illustrated units. Aspects of the disclosure may be suitably employed in many devices, which include the disclosed heterojunction bipolar transistor.

Figure 13:
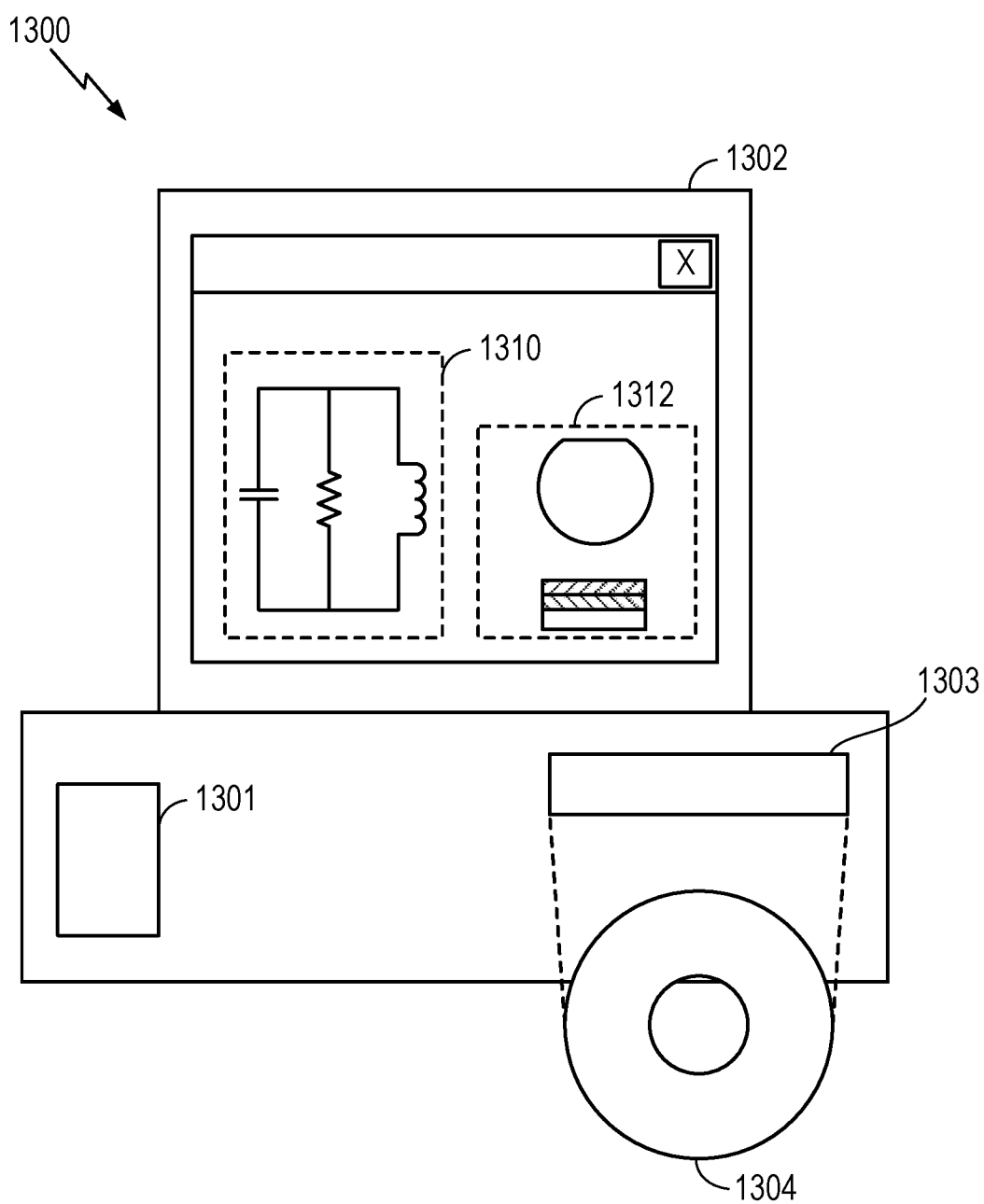
FIG. 13 is a block diagram illustrating a design workstation used for circuit, layout, and logic design.

FIG. 13 is a block diagram illustrating a design workstation used for circuit, layout, and logic design of the heterojunction bipolar transistor. A design workstation 1300 includes a hard disk 1301 containing operating system software, support files, and design software such as Cadence or OrCAD. The design workstation 1300 also includes a display 1302 to facilitate design of a circuit 1310 or the heterojunction bipolar transistor 1312. A storage medium 1304 is provided for tangibly storing the design of the circuit 1310 or the heterojunction bipolar transistor 1312. The design of the circuit 1310 or the heterojunction bipolar transistor 1312 may be stored on the storage medium 1304 in a file format such as GDSII or GERBER. The storage medium 1304 may be a CD-ROM, DVD, hard disk, flash memory, or other appropriate device. Furthermore, the design workstation 1300 includes a drive apparatus 1303 for accepting input from or writing output to the storage medium 1304.

Data recorded on the storage medium 1304 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1304 facilitates the design of the circuit 1310 or the heterojunction bipolar transistor 1312 by decreasing the number of processes for designing semiconductor wafers.

For a firmware and/or software implementation, the methodologies may be implemented with modules (e.g., procedures, functions, and so on) that perform the functions described. A machine-readable medium tangibly embodying instructions may be used in implementing the methodologies described. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described but is to be accorded the widest scope consistent with the principles and novel features disclosed.

What is claimed is:

1. A heterojunction bipolar transistor (HBT), comprising:
   an emitter on a first-side of a semiconductor-on-insulator (SOI) layer of an SOI substrate, the emitter accessed from the first-side;
   a base; and
   a collector accessed from a second-side of the SOI layer, the collector disposed laterally in-between two sections of the base, the base comprising a compound semiconductor layer configured to carry a charge between the emitter and the collector, in which the collector comprises a first doped region and a second doped region with a different doping concentration, and in which at least one of the first doped region and the second doped region comprises a diffusion region.

2. The heterojunction bipolar transistor of claim 1, in which the first doped region and the second doped region comprise N-type regions.

3. The heterojunction bipolar transistor of claim 1, in which the first doped region and the second doped region comprise P-type regions.

4. The heterojunction bipolar transistor of claim 1, in which the base comprises a raised base, a portion of the raised base protruding into a layer of the HBT that includes a portion of the emitter.

5. The heterojunction bipolar transistor of claim 1, in which the first-side is a front-side and the second-side is a backside.

6. The heterojunction bipolar transistor of claim 1, in which the first-side is a backside and the second-side is a front-side.

7. The heterojunction bipolar transistor of claim 1, further comprising a second-side dielectric layer on a buried dielectric layer, the collector within the buried dielectric layer.

8. The heterojunction bipolar transistor of claim 7, in which the buried dielectric layer comprises a buried oxide (BOX) layer.

9. The heterojunction bipolar transistor of claim 1, further comprising:
   a first-side dielectric layer on the emitter; and
   a handle substrate on the first-side dielectric layer.

10. A method of making a heterojunction bipolar transistor (HBT), comprising:
    fabricating an emitter on a first-side of a semiconductor-on-insulator (SOI) layer of an SOI substrate, the emitter accessed from the first-side;
    fabricating a collector accessed from a second-side of the SOI layer; and
    fabricating a section of a base on either side, laterally, of the collector, the base comprising a compound semiconductor layer configured to carry a charge between the emitter and the collector, in which the collector comprises a first doped region and a second doped region with a different doping concentration, and in which at least one of the first doped region and the second doped region comprises a diffusion region.

11. The method of claim 10, in which the first doped region and the second doped region comprise N-type regions or P-type regions.

12. A radio frequency (RF) front end module comprising:
    a heterojunction bipolar transistor (HBT) having an emitter on a first-side of a semiconductor-on-insulator (SOI) layer of an SOI substrate, the emitter accessed from the first-side; a base; and a collector accessed from a second-side of the SOI layer, the collector disposed laterally in-between two sections of the base, the base comprising a compound semiconductor layer configured to carry a charge between the emitter and the collector; and
    an antenna coupled to the HBT, in which the collector comprises a first doped region and a second doped region with a different doping concentration, and in which at least one of the first doped region and the second doped region comprises a diffusion region.

13. The RF front end module of claim 12, in which the first doped region and the second doped region comprise N-type regions.

14. The RF front end module of claim 12, in which the first doped region and the second doped region comprise P-type regions.

15. The RF front end module of claim 12, in which the base comprises a raised base, a portion of the raised base protruding into a layer of the HBT that includes a portion of the emitter.

16. The RF front end module of claim 12, further comprising a second-side dielectric layer on a buried dielectric layer, the collector within the buried dielectric layer.

* * * * *